(12) United States Patent
Hung et al.

(10) Patent No.: US 11,855,619 B2
(45) Date of Patent: Dec. 26, 2023

(54) POWER SWITCH CIRCUIT, IC STRUCTURE OF POWER SWITCH CIRCUIT, AND METHOD OF FORMING IC STRUCTURE

(71) Applicant: TAIWAN SEMICONDUCTOR MANUFACTURING COMPANY LTD., Hsinchu (TW)

(72) Inventors: Tzung-Yo Hung, Chiayi County (TW); Pin-Dai Sue, Tainan (TW); Chien-Chi Tien, Hsinchu (TW); Ting-Wei Chiang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 853 days.

(21) Appl. No.: 16/744,110

(22) Filed: Jan. 15, 2020

(65) Prior Publication Data
US 2021/0218398 A1 Jul. 15, 2021

(51) Int. Cl.
| | | |
|---|---|---|
| H03K 17/00 | (2006.01) | |
| H03K 17/687 | (2006.01) | |
| H03K 19/0948 | (2006.01) | |
| G05F 3/16 | (2006.01) | |
| H03K 19/0185 | (2006.01) | |
| H01L 21/02 | (2006.01) | |
| H01L 21/283 | (2006.01) | |
| H01L 21/822 | (2006.01) | |
| H01L 29/423 | (2006.01) | |
| H01L 29/06 | (2006.01) | |
| B82Y 10/00 | (2011.01) | |

(52) U.S. Cl.
CPC .......... *H03K 17/6872* (2013.01); *G05F 3/16* (2013.01); *H01L 21/02104* (2013.01); *H01L 21/283* (2013.01); *H01L 21/822* (2013.01); *H01L 29/0669* (2013.01); *H01L 29/42312* (2013.01); *H03K 19/018571* (2013.01); *H03K 19/0948* (2013.01); *B82Y 10/00* (2013.01)

(58) Field of Classification Search
CPC ... H01L 24/00; H01L 222/1094; H01L 24/02; H01L 24/02104; H01L 24/02008; H01L 24/0201; H01L 24/02109; H01L 24/02112; H01L 21/70; H01L 29/0665; H01L 29/0669
USPC ................................. 327/564, 565; 438/313
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Hai L Nguyen
(74) *Attorney, Agent, or Firm* — WPAT LAW; Anthony King

(57) ABSTRACT

An integrated circuit device includes: an integrated circuit module; a first field-effect transistor coupled between the integrated circuit module and a first reference voltage, and controlled by a first controlled signal; and a second field-effect transistor coupled between the integrated circuit module and the first reference voltage; wherein the second field-effect transistor is a complementary field-effect transistor of the first field-effect transistor, and the first field-effect transistor and the second field-effect transistor are configured to generate a second reference voltage for the integrated circuit module according to the first control signal.

20 Claims, 14 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,691,750 B2 * | 6/2017 | Chou | H01L 27/0207 |
| 11,182,529 B2 * | 11/2021 | Tien | G06F 30/392 |

* cited by examiner

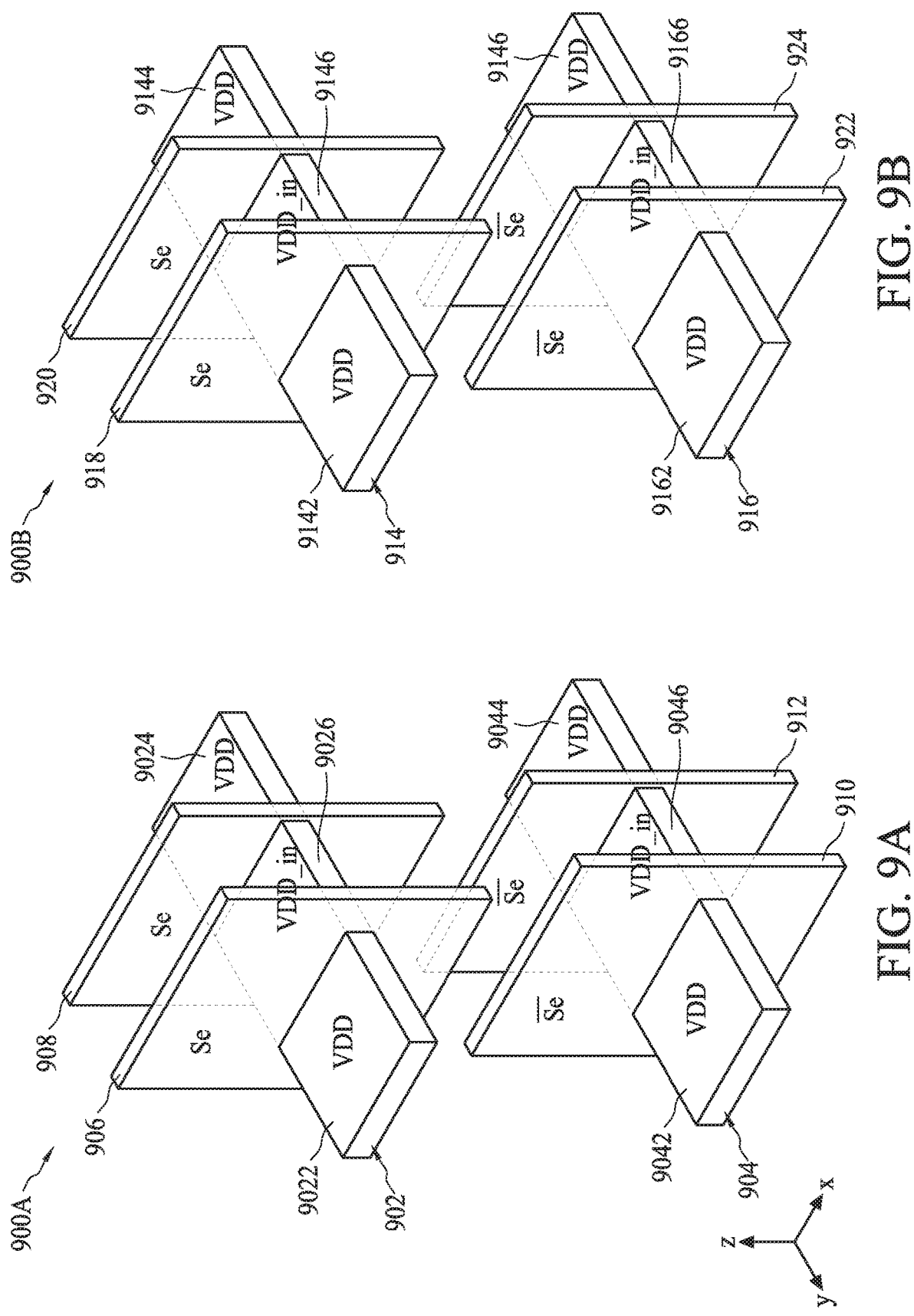

POWER SWITCH CIRCUIT, IC STRUCTURE OF POWER SWITCH CIRCUIT, AND METHOD OF FORMING IC STRUCTURE

BACKGROUND

A power switch is coupled between a supply power and a functional circuit for selectively supplying power to the functional circuit. For example, when the functional circuit is under sleep mode, the power switch may be opened to cut off the power of the functional circuit for reducing the power consumption of the circuit system. The power switch may be controlled by signals generated by a controller that may control the operating mode of the functional circuit. To increase the operating speed of the circuit system, a power switch should have strong wake up force to power-up the functional circuit when the operation mode of the functional circuit is changed into the normal operation mode from the sleep mode, for example. However, the power switch with strong wake up force may occupy a large area in the circuit system. Therefore, a novel architecture of power switch without the area penalty is highly desirable in the field of advanced IC (Integrated circuit) device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9A is a diagram illustrating a layout structure of a power switch circuit in accordance with some embodiments.

FIG. 9B is a diagram illustrating a layout structure of a power switch circuit in accordance with some embodiments.

DETAILED DESCRIPTION

Figure 1:
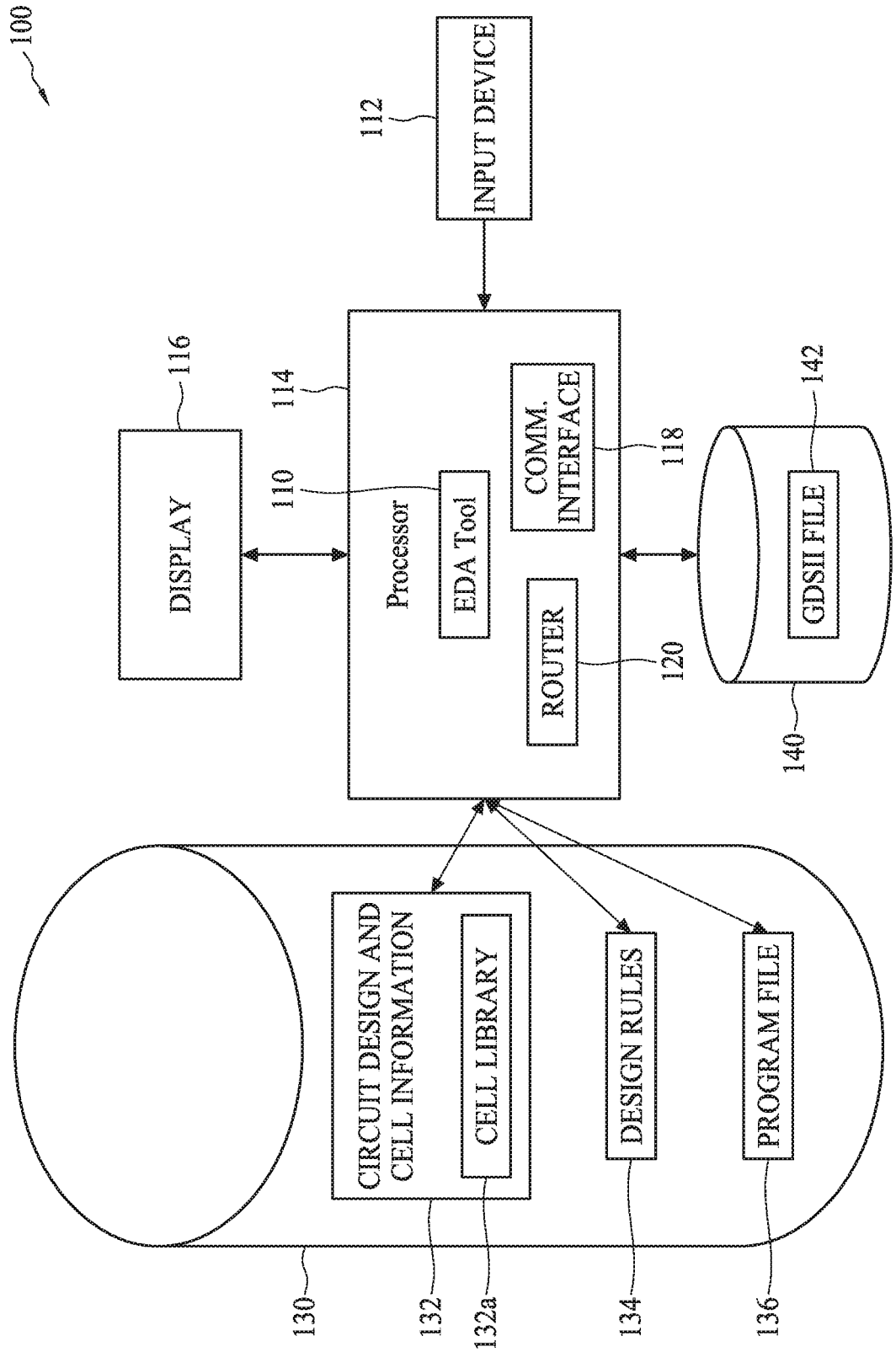
FIG. 1 is a diagram illustrating an electronic design automation system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram illustrating an electronic design automation system 100 in accordance with some embodiments. As shown in FIG. 1, system 100 includes an electronic design automation ("EDA") tool 110 having a place and route tool including a chip assembly router 120.

The EDA tool 110 is a special purpose computer formed by retrieving stored program instructions 136 from a computer readable storage medium 130, 140 and executing the instructions on a general purpose processor 114. Processor 114 may be any central processing unit ("CPU"), microprocessor, micro-controller, or computational device or circuit for executing instructions. The non-transitory machine readable storage medium 130, 140 may be a flash memory, random access memory ("RAM"), read only memory ("ROM"), or other storage medium. Examples of RAMs include, but are not limited to, static RAM ("SRAM") and dynamic RAM ("DRAM"). ROMs include, but are not limited to, programmable ROM ("PROM"), electrically programmable ROM ("EPROM"), and electrically erasable programmable ROM ("EEPROM"), to name a few possibilities.

System 100 may include a display 116 and a user interface or input device 112 such as, for example, a mouse, a touch screen, a microphone, a trackball, a keyboard, or other device through which a user may input design and layout instructions to system 100. The one or more computer readable storage mediums 130, 140 may store data input by a user such as a circuit design and cell information 132, which may include a cell library 132*a*, design rules 134, one or more program files 136, and one or more graphical data system ("GDS") II files 142.

EDA tool 110 may also include a communication interface 118 allowing software and data to be transferred between EDA tool 110 and external devices. Examples of a communications interface 118 include, but are not limited to, a modem, an Ethernet card, a wireless network card, a Personal Computer Memory Card International Association ("PCMCIA") slot and card, or the like. Software and data transferred via communications interface 118 may be in the form of signals, which may be electronic, electromagnetic, optical, or the like that are capable of being received by communications interface 118. These signals may be provided to communications interface 118 via a communications path (e.g., a channel), which may be implemented using wire, cable, fiber optics, a telephone line, a cellular link, a radio frequency ("RF") link and other communication channels. The communications interface 118 may be a wired link and/or a wireless link coupled to a local area network (LAN) or a wide area network (WAN).

Router 120 is capable of receiving an identification of a plurality of cells to be included in a circuit layout, including a list 132 of pairs of cells, selected from the cell library 132 *a*, within the plurality of cells to be connected to each other. Design rules 134 may be used for a variety of processing technologies. In some embodiments, the design rules 134 configure the router 120 to locate connecting lines and vias on a manufacturing grid. Other embodiments may allow the router to include off-grid connecting lines and/or vias in the layout.

Figure 2:
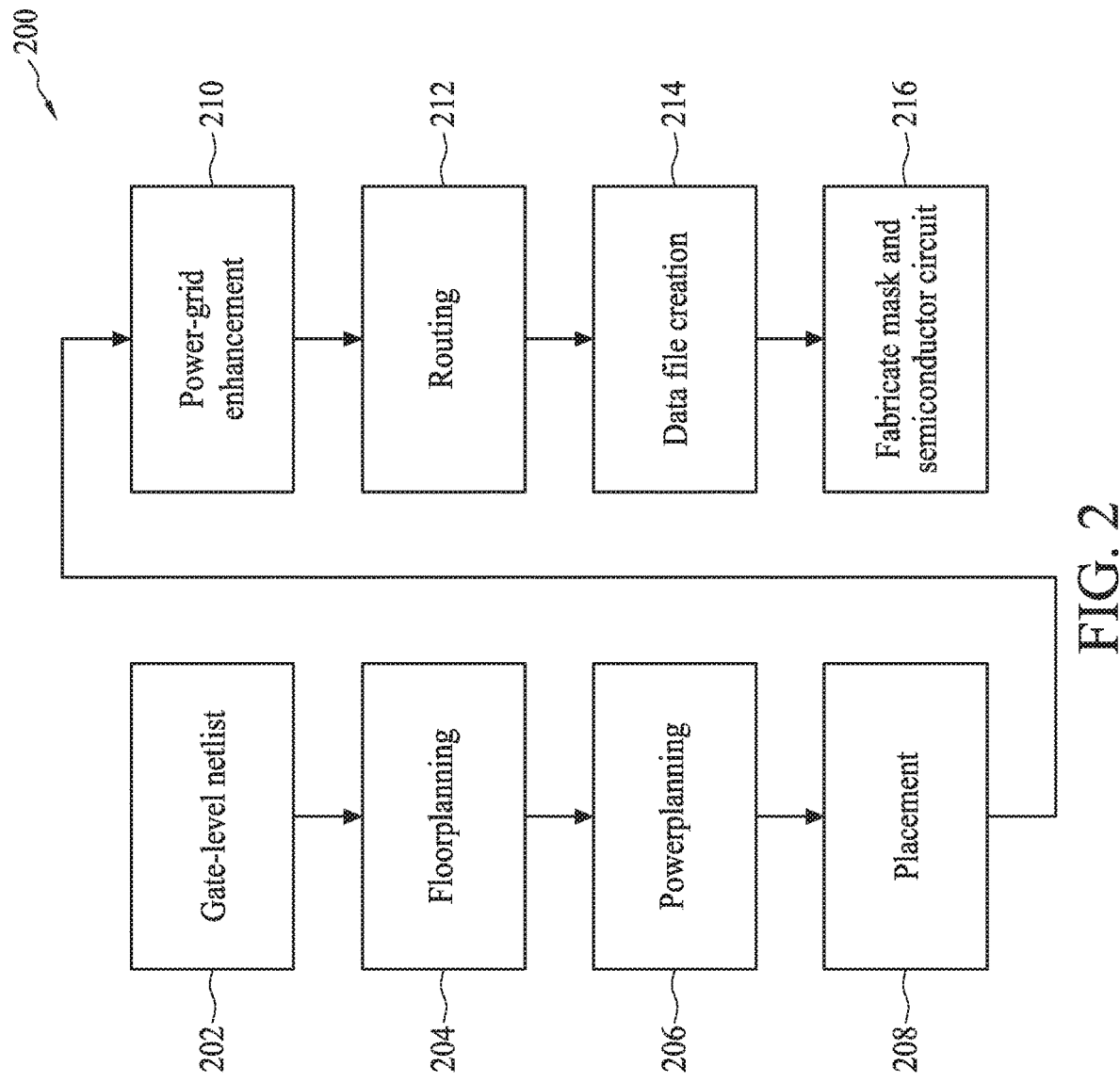
FIG. 2 illustrates one example of a method of designing and fabricating a semiconductor-based circuit.

FIG. 2 illustrates one example of a method 200 of designing and fabricating a semiconductor-based circuit. In operation 202, a gate-level netlist is developed or extracted. As will be understood by one of ordinary skill in the art, the gate-level netlist can be extracted from circuit schematic by processor 114 of system 100.

In operation 204, floor planning for the semiconductor circuit is performed by system 100. In some embodiments, floor planning includes dividing a circuit into functional blocks, which are portions of the circuit, and identifying the layout for these functional blocks.

In operation 206, power planning for the semiconductor circuit is performed by system 100. Power planning includes identifying the power layout for the functional blocks of the semiconductor circuit. For example, the conductive traces for routing power and ground on the various conductive layers of the semiconductor circuit.

In operation 208, system 100 performs placement for the semiconductor circuit. According to some embodiments, the circuit placement includes determining the placement for the electronic components, circuitry, and logic elements. For example, the placement of the transistors, resistors, inductors, logic gates, and other elements of the semiconductor circuit are selected in operation 208.

In operation 210, system 100 performs power-grid enhancement.

In operation 212, the routings for the devices and semiconductor circuit are mapped. Routing in operation 212 is performed by router 120 of system 100.

In operation 214, a data file, such as a graphic database system ("GDS") II file, including data representing the physical layout of the circuit is generated and stored in a non-transient machine readable storage 140. As will be understood by one of ordinary skill in the art, the data file is used by mask making equipment, such as an optical pattern generator, to generate one or more masks for the circuit.

In operation 216, one or more masks for the semiconductor circuit are created based on the data file stored in operation 214. Once the physical design layout is generated, the physical design may be sent to a manufacturing tool to generate photolithographic masks that may be used for fabricating the semiconductor circuit. The physical design layout may be sent to the manufacturing tool through that the LAN/WAN or other suitable forms of transmission from the EDA to the manufacturing tool.

According to some embodiments, in the operation 202, an integrated circuit (IC) module with a novel power switch circuit is designed. The power switch circuit may be a header switch and/or a footer switch of the IC module. The IC module may be a random access memory (RAM). For example, the RAM may be a dynamic random access memory (DRAM) and a static random access memory (SRAM). The power switch circuit is connected to a first reference voltage (e.g. a core supply voltage) and to provide a second reference voltage (e.g. an intermediate supply voltage) to the IC module according to an operation mode of the IC module. The intermediate supply voltage may be lower than or the same with the core supply voltage. For example, when the IC module is a RAM module, the power switch circuit is arranged to provide the intermediate supply voltage to the IC module during the read mode of the IC module, and the power switch circuit is arranged to stop provide the intermediate supply voltage to the IC module during the write mode of the IC module. It is noted that, when the power switch is a footer switch of the IC module, the power switch circuit is connected to a first reference voltage (e.g. a core ground voltage) and to provide a second reference voltage (e.g. an intermediate ground voltage) to the IC module according to an operation mode of the IC module. The intermediate ground voltage may be higher than or the same with the core ground voltage.

According to some embodiments, the transistors in the IC module and the power switch circuit are implemented by complementary field-effect transistor (CFET). A CFET device may be a modification of a gate-all-around transistor or device. A CFET stacks both n-type and p-type devices on each other. In CFET device, the nFET and pFET wires are stacked on each other. A CFET may be an nFET stacked on top of a pFET wire, or two or more nFETs stacked on top of two or more pFET wires. Therefore, in the operation 208, the layouts of the power switch circuit and the IC module may be formed on a layout architecture having a plurality of interleaving n-type nanowires and p-type nanowires. It is noted that a nanowire may be regarded as a semiconductor fin.

Figure 3:
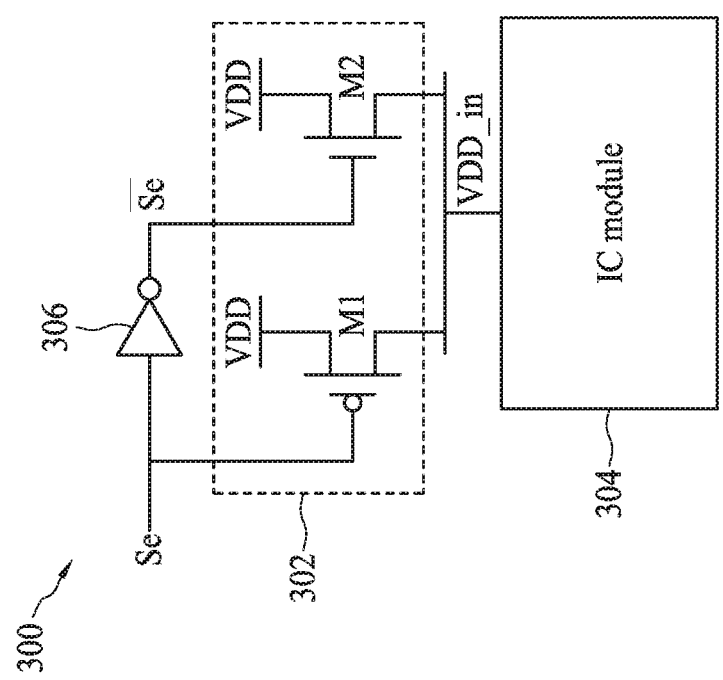
FIG. 3 is a diagram illustrating an IC device in accordance with some embodiments.

FIG. 3 is a diagram illustrating an IC device 300 in accordance with some embodiments. The IC device 300 comprises a power switch circuit 302 and an IC module 304. The power switch circuit 302 may be a header switch or a footer switch of the IC module 304. The power switch circuit 302 may also comprise a header switch and a footer switch of the IC module 304. When the power switch circuit 302 is the header switch the IC module 304, the power switch circuit 302 is connected to a core supply voltage VDD and to provide an intermediate supply voltage VDD_in to the IC module 304 according to an operation mode of the IC module 304. When the power switch circuit 302 is the footer switch (not shown) the IC module 304, the power switch circuit 302 is connected to a core ground voltage VGND and to provide an intermediate ground voltage VGND_in to the IC module 304 according to the operation mode of the IC module 304. For brevity, the present embodiments mainly focus on the header switch of the IC module 304. A person skilled in this art may understand the corresponding footer switch of the IC module 304 after reading the description related to the header switch of the IC module 304.

According to some embodiments, the IC device 300 further comprises an inverter 306 coupled to the power switch circuit 302. The power switch circuit 302 comprises a p-type field-effect transistor (pFET) M1 and an n-type field-effect transistor (nFET) M2. Each of the pFET M1 and the nFET M2 may comprise two connecting terminals (e.g. a drain and a source) and one control terminal (e.g. a gate). The pFET M1 and the nFET M2 are configured to be a complementary field-effect transistor (CFET) structure. The pFET M1 may be a complementary FEE of the nFET M2. The source of the pFET M1 and the drain of the nFET M2 are coupled to the core supply voltage VDD. The gate of the pFET M1 is coupled to an enable signal Se and the input terminal of the inverter 306. The gate of the nFET M2 is coupled to the output terminal of the inverter 306. The drain of the pFET M1 and the source of the nFET M2 are arranged to output the intermediate supply voltage VDD_in to the IC module 304.

According to some embodiments, the inverter 306 is arranged to invert the voltage level of the enable signal Se. As the pFET M1 and the nFET M2 are controlled by the enable signals Se with complementary voltage levels respectively, the pFET M1 and the nFET M2 may be turned on and off substantially at the same time.

Figure 4:
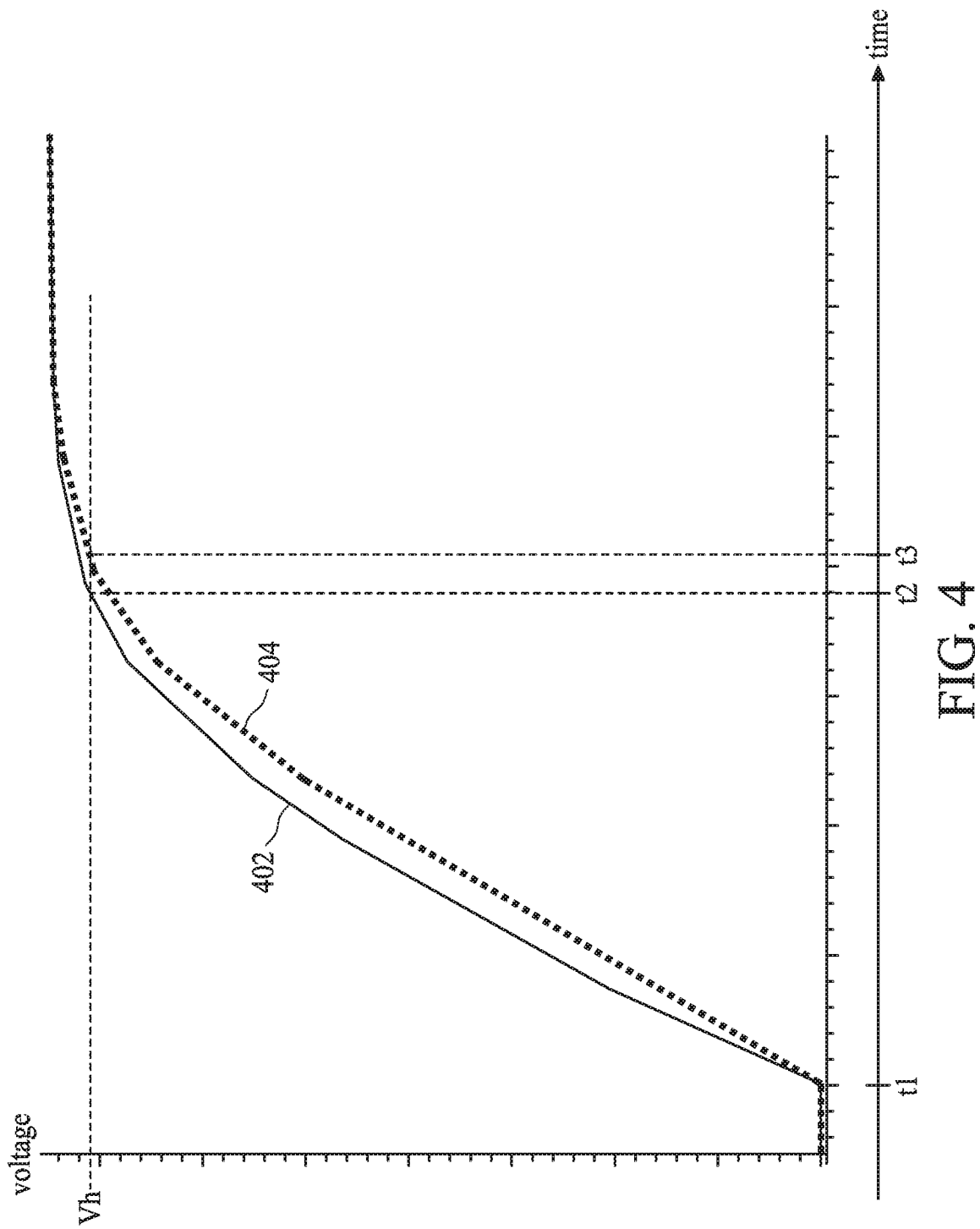
FIG. 4 is a timing diagram illustrating an intermediate supply voltage of a power switch circuit in accordance with some embodiments.

FIG. 4 is a timing diagram illustrating the intermediate supply voltage VDD_in provided by the power switch circuit 302 when the power switch circuit 302 is enabled by the enable signal Se in accordance with some embodiments. The curve 402 represents the variation of the intermediate supply voltage VDD_in, and the curve 404 represents the variation of an existing intermediate supply voltage provided by an existing power switch circuit (not shown). At time t1, the power switch circuit 302 is turned on by the enable signal Se, e.g. the voltage level of the enable signal Se transits to the low voltage level (e.g. VGND) from the high voltage level (e.g. VDD) at time t1. The voltage level of the intermediate supply voltage VDD_in (i.e. the curve 402) starts rising after time t1. At time t2, the voltage level of the intermediate supply voltage VDD_in starts curve 402 reaches the high voltage level Vh, which is close to the voltage level VDD, at time t2. On the other hand, for the existing power switch circuit, the curve 404 also starts rising after time t1, and reaches the high voltage level Vh at time t3. In comparison to the existing art, the wake-up time or rising time of the intermediate supply voltage VDD_in is improved. Therefore, the power switch circuit 302 provides the intermediate supply voltage VDD_in with a relatively strong wake-up force without occupy extra area of the semiconductor wafer, which will be described in the later paragraphs. When the power switch circuit 302 has a relatively strong wake-up force, the different wake-up times of the pFET M1 and the nFET M2 in the power switch circuit 302 caused by the process variation, e.g. the SF corner or FS corner, may be mitigated. The process corners occurred in the fabrication such that the operating speed of a power switch circuit 302 may be tuned or adjusted after the fabrication. The process corner may be a variation of fabrication parameters used in applying an integrated circuit design to a semiconductor wafer. For example, the process corner may be fast-fast (FF), slow-slow (SS), slow-fast (SF), or fast-slow (FS) corner, in which the first letter (e.g. "F" in FS corner) refers to the N-channel MOSFET (NMOS) corner, and the second letter (e.g. "S" in FS corner) refers to the P channel (PMOS) corner.

Figure 5:
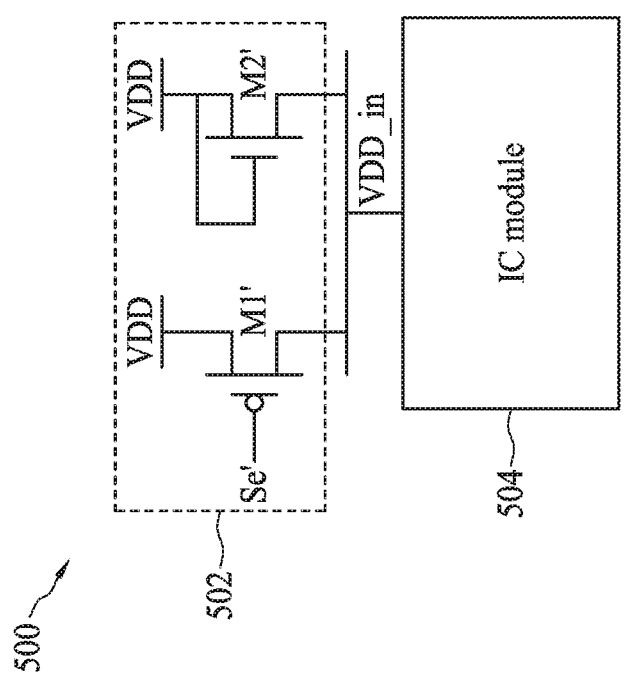
FIG. 5 is a diagram illustrating an IC device in accordance with some embodiments.

The embodiment of the power switch circuit 302 in FIG. 1 is to apply the enable signals (e.g. Se) with different voltage levels to the gates of the pFET M1 and the nFET M2. However, this is not a limitation of the present embodiments. The enable signal Se may be arranged to control one of the pFET M1 and the nFET M2 as shown in FIG. 5. FIG. 5 is a diagram illustrating an IC device 500 in accordance with some embodiments. The IC device 500 comprises a power switch circuit 502 and an IC module 504. The power switch circuit 502 is the header switch the IC module 504, and the power switch circuit 502 is connected to the core supply voltage VDD to provide the intermediate supply voltage VDD_in to the IC module 504 according to an operation mode of the IC module 504.

According to some embodiments, the power switch circuit 502 comprises a pFET M1' and an nFET M2'. The pFET M1' and the nFET M2' are configured to be a CFET. The source of the pFET M1' and the drain of the nFET M2' are coupled to the core supply voltage VDD. The gate of the pFET M1' is coupled to an enable signal Se'. The gate of the nFET M2' is coupled to the drain of the nFET M2'. The drain of the pFET M1' and the source of the nFET M2' are arranged to output the intermediate supply voltage VDD_in to the IC module 504.

According to some embodiments, the enable signal Se' is arranged to control the on/off of the pFET M1'. When the enable signal Se' turns on the pFET M1' by the low voltage level (e.g. VGND), the pFET M1' is arranged to provide the intermediate supply voltage VDD_in with the voltage level of VDD to the IC module 504. When the enable signal Se' turns off the pFET M1' by the high voltage level (e.g. VDD), the nFET M2' is arranged to provide the intermediate supply voltage VDD_in with the voltage level of VDD-VT to the IC module 504, in which the parameter VT is the threshold voltage of the nFET M2'. In other words, the power switch circuit 502 is arranged to selectively provide the intermediate supply voltage VDD_in with the voltage level of VDD or the intermediate supply voltage VDD_in with the voltage level of VDD-VT to the IC module 504 according to the operation mode (or the voltage level of the enable signal Se') of the IC module 504. For example, when the IC module 504 is a data storage module (e.g. a RAM module), the power switch circuit 502 is arranged to provide the intermediate supply voltage VDD_in with the voltage level of VDD to the IC module 504 during the read mode in the normal operation of the IC module 504, and the power switch circuit 502 is arranged to provide the intermediate supply voltage VDD_in with the voltage level of VDD-VT, which is lower than the voltage level VDD, to the IC module 504 during the sleep mode of the IC module 504. During the sleep mode, the data in the IC module 504 may be kept intact by a lower supply voltage, i.e. VDD-VT. Accordingly, the total power consumption of the IC device 500 may be reduced.

Figure 6:
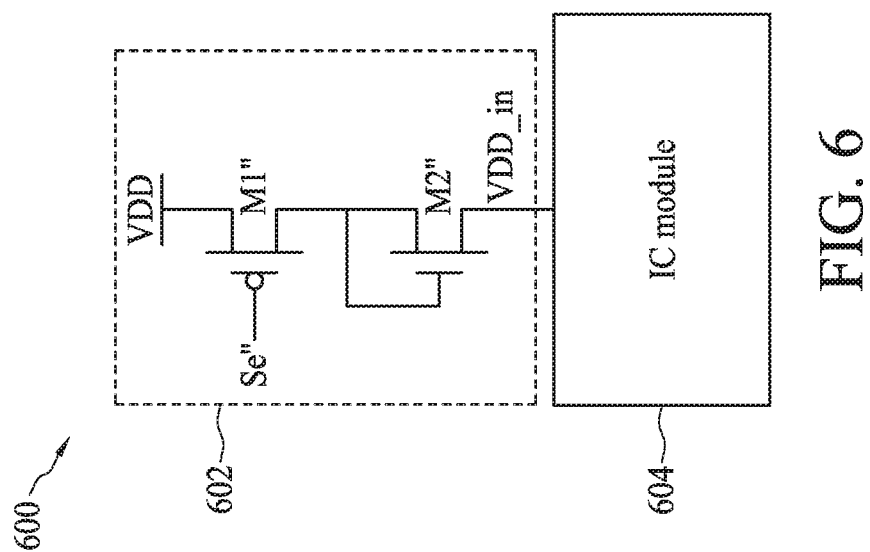
FIG. 6 is a diagram illustrating an IC device in accordance with some embodiments.

FIG. 6 is a diagram illustrating an IC device 600 in accordance with some embodiments. The IC device 600 comprises a power switch circuit 602 and an IC module 604. The power switch circuit 602 is the header switch the IC module 604, and the power switch circuit 602 is connected to the core supply voltage VDD to provide the intermediate supply voltage VDD_in to the IC module 504 according to an operation mode of the IC module 604.

According to some embodiments, the power switch circuit 602 comprises a pFET M1" and an nFET M2". The pFET M1" and the nFET M2" are configured to be a CFET. The source of the pFET M1" is coupled to the core supply voltage VDD. The gate of the pFET M1" is coupled to an enable signal Se". The drain of the nFET M2" is coupled to the drain of the pFET M1". The gate of the nFET M2" is coupled to the drain of the nFET M2". The source of the nFET M2" is arranged to output the intermediate supply voltage VDD_in to the IC module 604.

According to some embodiments, the nFET M2" is configured to be a diode-connect transistor. The enable signal Se" is arranged to control the on/off of the pFET M1". When the enable signal Se" turns on the pFET M1" by the low voltage level (e.g. VGND), the pFET M1" is arranged to provide the intermediate supply voltage VDD_in with the voltage level of VDD-VT to the IC module 604, in which the parameter VT is the threshold voltage of the nFET M2". When the enable signal Se" turns off the pFET M1" by the high voltage level (e.g. VDD), the connection between the core supply voltage VDD and the IC module 604 is opened to power-off the IC module 604. In other words, the power switch circuit 602 is arranged to selectively provide the intermediate supply voltage VDD_in with the voltage level of VDD-VT to the IC module 604 according to the operation mode (or the voltage level of the enable signal Se") of the IC module 604. The nFET M2" may be regarded as a retention diode between the pFET M1" and the IC module 604, and the pFET M1" may be a controlling switch for the retention diode. As the power switch circuit 602 is arranged to provide the intermediate supply voltage VDD_in with the voltage level of VDD-VT, which is lower than the voltage level VDD, to the IC module 604, the total power consumption of the IC device 600 may be reduced.

Figure 7:
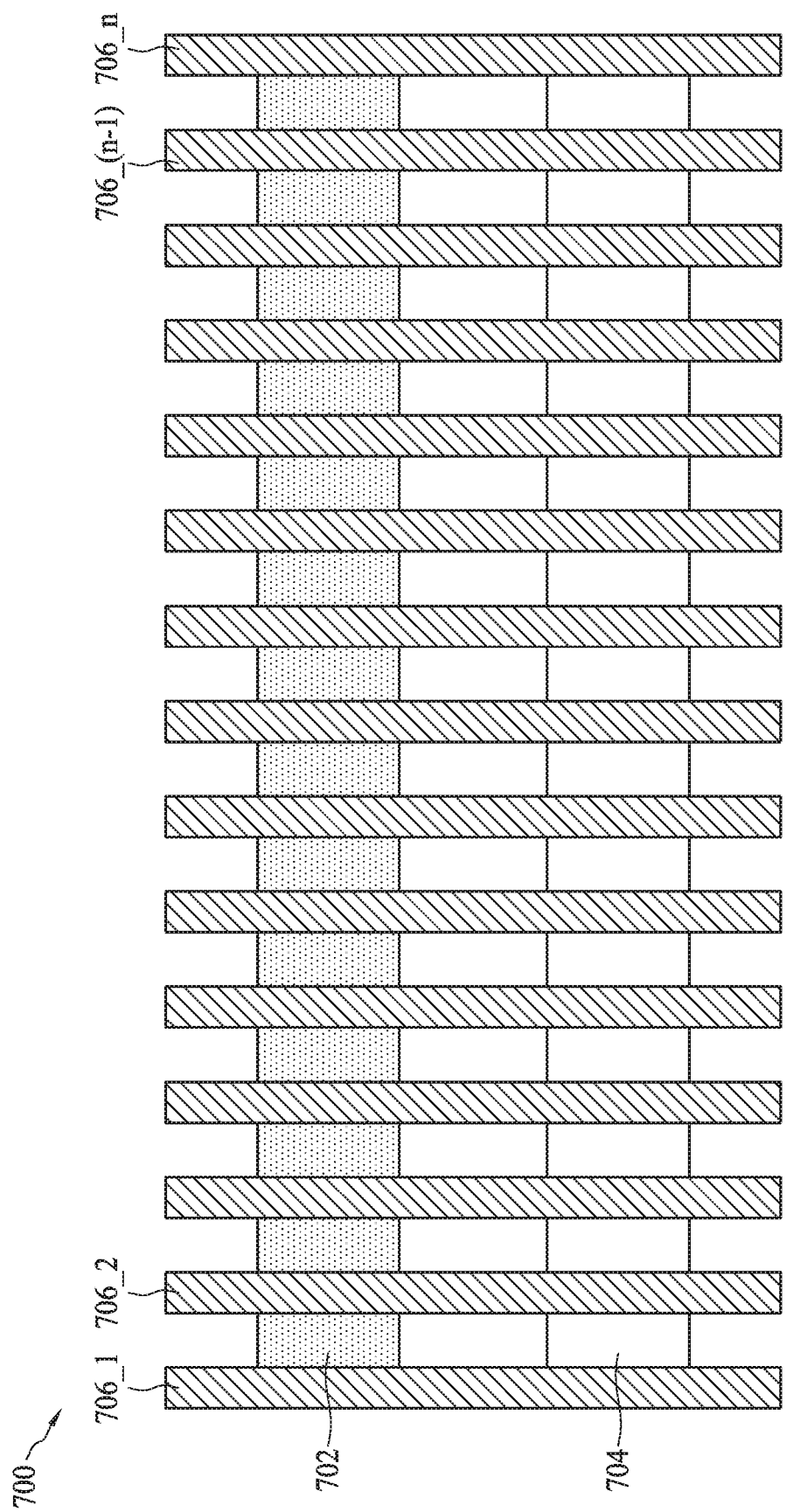
FIG. 7 is a cross-sectional diagram illustrating a portion of a CFET layout in accordance with some embodiments.

FIG. 7 is a cross-sectional diagram illustrating a portion of a CFET layout 700 in accordance with some embodiments. For brevity, the CFET layout 700 merely shows a p-type diffusion nanowire 702, an n-type diffusion nanowire 704, and a plurality of conductive layers 706_1-706_n. According to some embodiments, the material of the plurality of conductive layers 706_1-706_n may be polysilicon or metal or a combination of polysilicon and metal. The polysilicon is polycrystalline silicon, which is a high purity, polycrystalline form of silicon. The metal may be aluminum (Al). The semiconductor substrate, contacts, the metal layers, the via structures, and the power rails are omitted in FIG. 7. According to some embodiments, the p-type diffusion nanowire 702 is vertically stacked on the n-type diffusion nanowire 704. Therefore, a pFET may be formed over an nFET. The plurality of conductive layers 706_1-706_n are arranged to surround the p-type diffusion nanowire 702 and the n-type diffusion nanowire 704 to form the gates of the pFET(s) and the nFET(s) respectively. It is noted that plurality of conductive layers 706_1-706_n are not directly contacted with the p-type diffusion nanowire 702 and the n-type diffusion nanowire 704. For each conductive layer, at least a gate dielectric or a dielectric layer (not shown) is disposed between the conductive layer (e.g. 706_1) and the diffusion nanowire (e.g. 702 and 704). The gate dielectric may be a high permittivity (high-k) dielectric layer. According to some embodiments, the high-k material may be oxide of tantalum (e.g. $Ta_2O_5$), oxide of zirconium ($ZrO_2$), oxide of aluminum, or oxide of silicon (e.g. $SiO_2$), or $Al_3N_4$, for example. The gate dielectric may be formed or deposited by a process of chemical vapor deposition (CVD).

According to some embodiments, the n-type diffusion nanowire 704 may be vertically stacked on the p-type diffusion nanowire 702. Moreover, a plurality of consecutive n-type diffusion nanowires 704 may be vertically stacked on a plurality of consecutive p-type diffusion nanowires 702, or a plurality of consecutive p-type diffusion nanowires 702 may be vertically stacked on a plurality of consecutive n-type diffusion nanowires 704.

Figure 8:
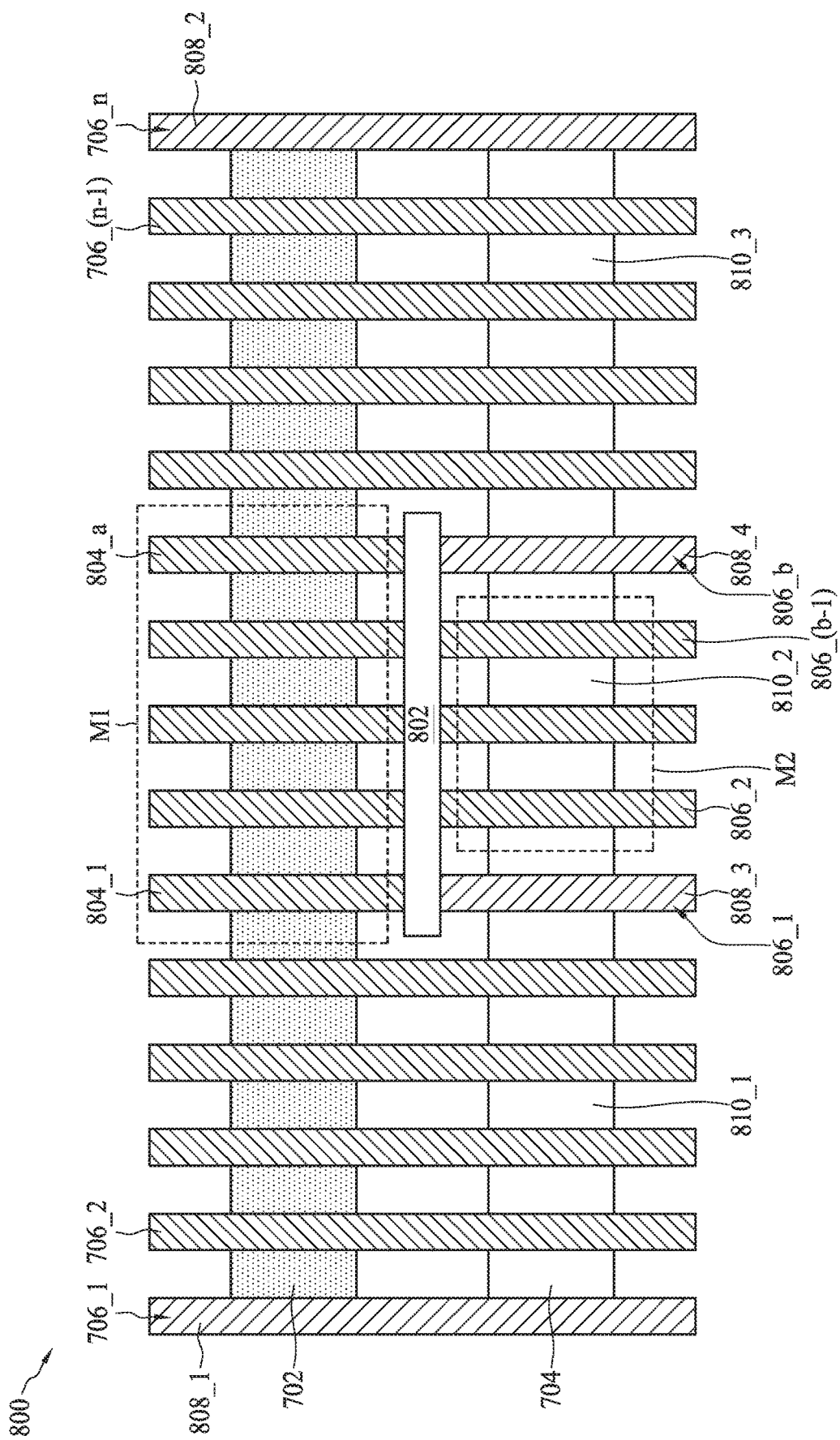
FIG. 8 is a cross-sectional diagram illustrating a layout of a power switch circuit in accordance with some embodiments.

According to some embodiments, the CFET layout 700 may be applied to form the layout 800 of the above mentioned power switch circuits (e.g. 302, 502, or 602). FIG. 8 is a cross-sectional diagram illustrating a layout 800 of a power switch circuit in accordance with some embodiments. For brevity, the power switch circuit is the above mentioned power switch circuit 302. According to some embodiments, a cut-poly layer 802 is disposed on a portion of the plurality of conductive layers 706_1-706_n, and the cut-poly layer 802 is located on a position between the p-type diffusion nanowire 702 and the n-type diffusion nanowire 704. The cut-poly layer 802 is arranged to cut or separate the portion of conductive layers into the gate electrode (e.g. 804_1-804_a) of the pFET M1 and the gate electrode (e.g. 806_1-806_b) of the nFET M2 after the fabrication of the power switch circuit 302. It is noted that there is no physical structure of cut-poly layer 802 in the fabricated IC structure. The cut-poly layer 802 shown in the layout 800 represents that a specific mask structure is used to cut the covering conductive layers during the fabrication step. In the fabricated IC structure, the area covered by a cut-poly layer may be a space filled in by dielectric material as the portion of the conductive layer is removed.

In addition, the layout 800 further comprises four cut-diffusion layers 808_1-808_4. The cut-diffusion layers 8081 and 808_2 are disposed on the edges of the p-type diffusion nanowire 702 and the n-type diffusion nanowire 704 respectively, and the cut-diffusion layers 8081 and 808_2 are overlapped with the conductive layers 706_1 and 706_n respectively. The cut-diffusion layers 808_3 and 808_4 are overlapped with the conductive layers 806_1 and 806_b respectively. During the fabrication, a cut-diffusion layer may represent an edge of a diffusion layer. Therefore, the cut-diffusion layers 808_3 and 808_4 are arranged to cut the n-type diffusion nanowire 704 into three portions, i.e. 810_1-810_3. It is noted that there is no physical structure of cut-diffusion layers 808_1-808_4 in the fabricated IC structure. The cut-diffusion layers 808_1-808_4 shown in the layout 800 represents that a specific mask structure is used to cut the covering diffusion nanowires (i.e. 702 and 704) during the fabrication step. In the fabricated IC structure, the area covered by a cut-diffusion layer may be a space filled in by dielectric material as the portion of the diffusion nanowire is removed. According to some embodiments, a structure connected poly on gate oxide and diffusion edge may be formed in the area of a cut-diffusion layer after fabrication.

Accordingly, the pFET M1 of the power switch circuit 302 comprises the p-type diffusion nanowire 702 and the conductive layers 804_1-804_a. The nFET M2 of the power switch circuit 302 comprises the n-type diffusion nanowire 810_2 and the conductive layers 806_2-806_(b−1). As the nFET M2 is formed on the existing area or dummy area under the pFET M1, the nFET M2 does not occupy extra area of the layout 800. Therefore, the performance the power switch circuit 302 may be improved by using the CFET structure without extra area penalty. More specifically, in an existing power switch circuit, the nFET M2 may be configured to be a dummy FET, which occupies area but does not improve the performance of the existing power switch circuit. On the contrary, in the present embodiments, the area of the dummy FET is reconfigured to be an FET (e.g. M2) that may boost the performance of the power switch circuit without extra area penalty.

FIG. 9A is a diagram illustrating an IC structure 900A of a power switch circuit in accordance with some embodiments. The IC structure 900A may be a portion of a CFET IC structure in which the p-type diffusion nanowire is vertically stacked on the n-type diffusion nanowire. The power switch circuit may be the above-mentioned power switch circuits 302, 502, or 602. In this embodiment, the power switch circuit is configured to be a header switch of an IC module. The IC structure 900A comprises a p-type diffusion nanowire 902, an n-type diffusion nanowire 904, a plurality of first conductive layers (e.g. 906 and 908), and a plurality of second conductive layers (e.g. 910 and 912). The p-type diffusion nanowire 902 and the n-type diffusion nanowire 904 are arranged to stack along the z-axis, and the p-type diffusion nanowire 902 is vertically stacked on the n-type diffusion nanowire 904. The conductive layers 906 and 908 are formed on the same level with the p-type diffusion nanowire 902 along y-axis. The conductive layers 910 and 912 are formed on the same level with the p-type diffusion nanowire 902 along y-axis. The conductive layers 906 and 908 are arranged to gate the p-type diffusion nanowire 902. The conductive layers 910 and 912 are arranged to gate the n-type diffusion nanowire 904.

According to some embodiments, the conductive layer 906 is aligned with the conductive layer 910 along the z-axis, and the conductive layer 908 is aligned with the conductive layer 912 along the z-axis. Moreover, the conductive layer 906 is physically separated from the conductive layer 910, and the conductive layer 908 is physically separated from the conductive layer 912.

According to some embodiments, the p-type diffusion nanowire 902 and the conductive layers 906 and 908 are arranged to form a gate-all-around PFET (e.g. M1). Therefore, the conductive layers 906 and 908 are electrically connected to an enable signal (e.g. Se) of the power switch circuit. The nanowire portions 9022 and 9024 are electrically connected to a core supply voltage (e.g. VDD) and the nanowire portion 9026 is arranged to provide an intermediate supply voltage (e.g. VDD_in) to the IC module.

In addition, the n-type diffusion nanowire 904 and the conductive layers 910 and 910 are arranged to form a gate-all-around NFET (e.g. M2). Therefore, the conductive layers 910 and 912 are electrically connected to an inverting signal of the enable signal (e.g. the inverted voltage level of the enable signal Se) of the power switch circuit. In addition, the nanowire portions 9042 and 9044 are electrically connected to a core supply voltage (e.g. VDD) and the nanowire portion 9046 is arranged to provide an intermediate supply voltage (e.g. VDD_in) to the IC module.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIG. 9B is a diagram illustrating an IC structure 900B of a power switch circuit in accordance with some embodiments. The IC structure 900B may be a portion of a CFET IC structure in which the n-type diffusion nanowire is vertically stacked on the p-type diffusion nanowire. The power switch circuit may be the above-mentioned power switch circuits 302, 502, or 602. In this embodiment, the power switch circuit is configured to be a header switch of an IC module. The IC structure 900B comprises an n-type diffusion nanowire 914, a p-type diffusion nanowire 916, a plurality of first conductive layers (e.g. 918 and 920), and a plurality of second conductive layers (e.g. 922 and 924). In comparison to the IC structure 900A, the n-type diffusion nanowire 914 of the IC structure 900B is vertically stacked on the p-type diffusion nanowire 916 of the IC structure 900B. In other words, the positions of the PFET, which comprises the p-type diffusion nanowire 916 and the conductive layers 922 and 924, and the NFET, which comprises the n-type diffusion nanowire 914 and the conductive layers 918 and 920, of the IC structure 900B are different from the positions of the PFET and the NFET of the IC structure 900A.

According to some embodiments, the conductive layers 918 and 920 are electrically connected to an enable signal (e.g. Se) of the power switch circuit. The nanowire portions 9142 and 9144 are electrically connected to a core supply voltage (e.g. VDD) and the nanowire portion 9146 is arranged to provide an intermediate supply voltage (e.g. VDD_in) to the IC module. In addition, the conductive layers 922 and 924 are electrically connected to an inverting signal of the enable signal (e.g. the inverted voltage level of the enable signal Se) of the power switch circuit. In addition, the nanowire portions 9162 and 9164 are electrically connected to a core supply voltage (e.g. VDD) and the nanowire portion 9166 is arranged to provide an intermediate supply voltage (e.g. VDD_in) to the IC module.

Figure 10B:
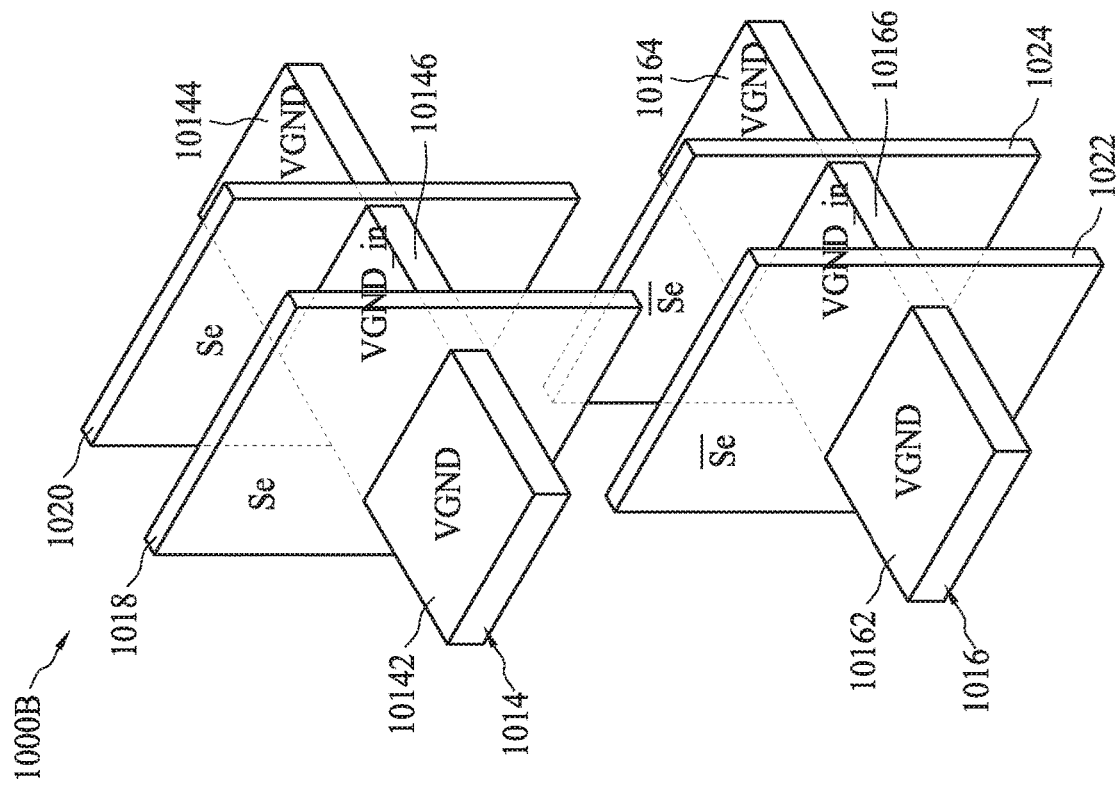
FIG. 10B is a diagram illustrating a layout structure of a power switch circuit in accordance with some embodiments.
Figure 10A:
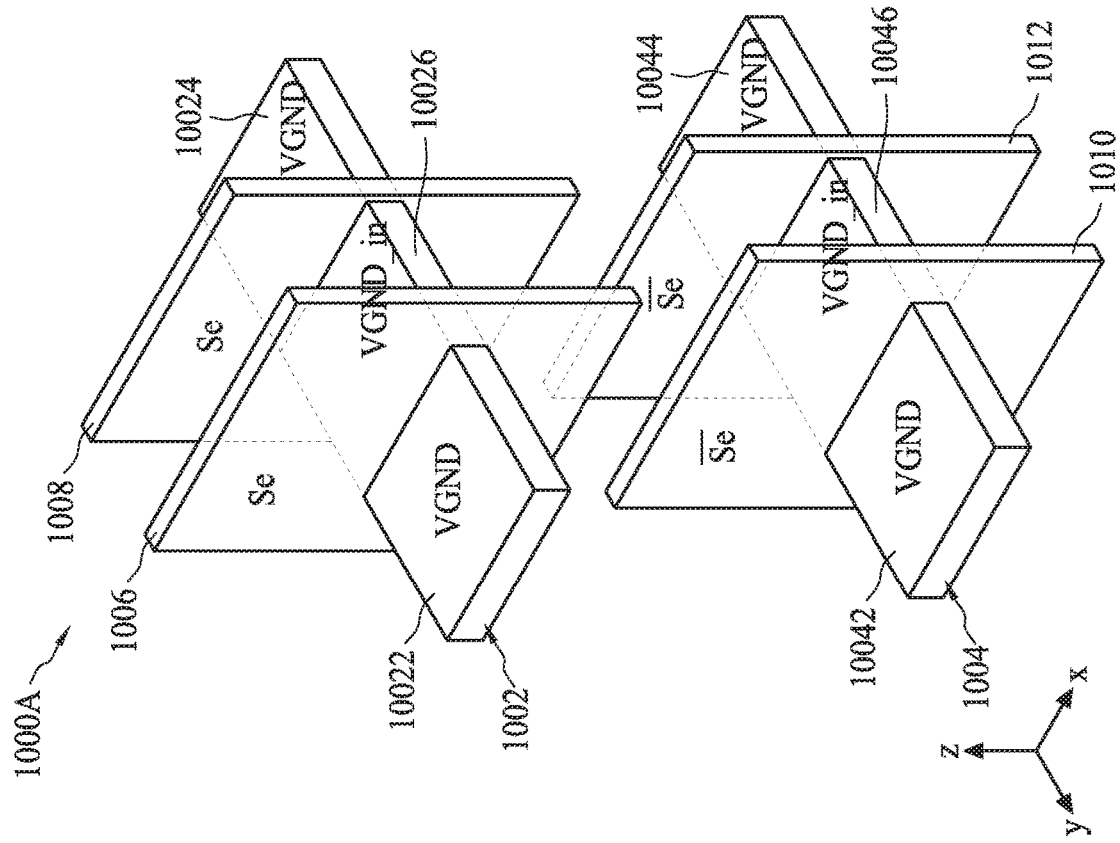
FIG. 10A is a diagram illustrating a layout structure of a power switch circuit in accordance with some embodiments.

FIG. 10A is a diagram illustrating an IC structure 1000A of a power switch circuit in accordance with some embodiments. The IC structure 1000A may be a portion of a CFET IC structure in which the p-type diffusion nanowire is vertically stacked on the n-type diffusion nanowire. In comparison to the power switch circuit of FIG. 9A, the power switch circuit of FIG. 10A is configured to be a footer switch of an IC module. Except for the connecting signals, the IC structure 1000A is similar to the IC structure 900A. Therefore, the detailed description of the IC structure 1000A is omitted here for brevity.

According to some embodiments, the p-type diffusion nanowire 1002 and the conductive layers 1006 and 1008 are configured to be a PFET. The n-type diffusion nanowire 1004 and the conductive layers 1010 and 1012 are configured to be an NFET. The conductive layers 1006 and 1008 are electrically connected to an enable signal (e.g. Se) of the power switch circuit. The nanowire portions 10022 and 10024 are electrically connected to a core ground voltage (e.g. VGND) and the nanowire portion 10026 is arranged to provide an intermediate ground voltage (e.g. VGND_in) to the IC module. In addition, the conductive layers 1010 and 1012 are electrically connected to an inverting signal of the enable signal (e.g. the inverted voltage level of the enable signal Se) of the power switch circuit. In addition, the nanowire portions 10042 and 10044 are electrically connected to a core ground voltage (e.g. VGND) and the nanowire portion 10046 is arranged to provide an intermediate ground voltage (e.g. VGND_in) to the IC module.

FIG. 10B is a diagram illustrating an IC structure 1000B of a power switch circuit in accordance with some embodiments. The IC structure 1000B may be a portion of a CFET IC structure in which the n-type diffusion nanowire is vertically stacked on the p-type diffusion nanowire. In comparison to the power switch circuit of FIG. 9B, the power switch circuit of FIG. 10B is configured to be a footer switch of an IC module. Except for the connecting signals, the IC structure 1000B is similar to the IC structure 900B. Therefore, the detailed description of the IC structure 1000B is omitted here for brevity.

According to some embodiments, the n-type diffusion nanowire 1014 and the conductive layers 1018 and 1020 are configured to be an NFET. The p-type diffusion nanowire 1016 and the conductive layers 1022 and 1024 are configured to be a PFET. The conductive layers 1018 and 1010 are electrically connected to an enable signal (e.g. Se) of the power switch circuit. The nanowire portions 10142 and 10144 are electrically connected to a core ground voltage (e.g. VGND) and the nanowire portion 10146 is arranged to provide an intermediate ground voltage (e.g. VGND_in) to the IC module. In addition, the conductive layers 1022 and 1024 are electrically connected to an inverting signal of the enable signal (e.g. the inverted voltage level of the enable signal Se) of the power switch circuit. In addition, the nanowire portions 10162 and 10164 are electrically connected to a core ground voltage (e.g. VGND) and the nanowire portion 10166 is arranged to provide an intermediate ground voltage (e.g. VGND_in) to the IC module.

The IC structure 900A comprises a p-type diffusion nanowire 902, an n-type diffusion nanowire 904, a plurality of first conductive layers (e.g. 906 and 908), and a plurality of second conductive layers (e.g. 910 and 912). The p-type diffusion nanowire 902 and the n-type diffusion nanowire 904 are arranged to stack along the z-axis, and the p-type diffusion nanowire 902 is vertically stacked on the n-type diffusion nanowire 904. The conductive layers 906 and 908 are formed on the same level with the p-type diffusion nanowire 902 along y-axis. The conductive layers 910 and 912 are formed on the same level with the p-type diffusion nanowire 902 along y-axis. The conductive layers 906 and 908 are arranged to gate the p-type diffusion nanowire 902. The conductive layers 910 and 912 are arranged to gate the n-type diffusion nanowire 904.

Figure 11B:
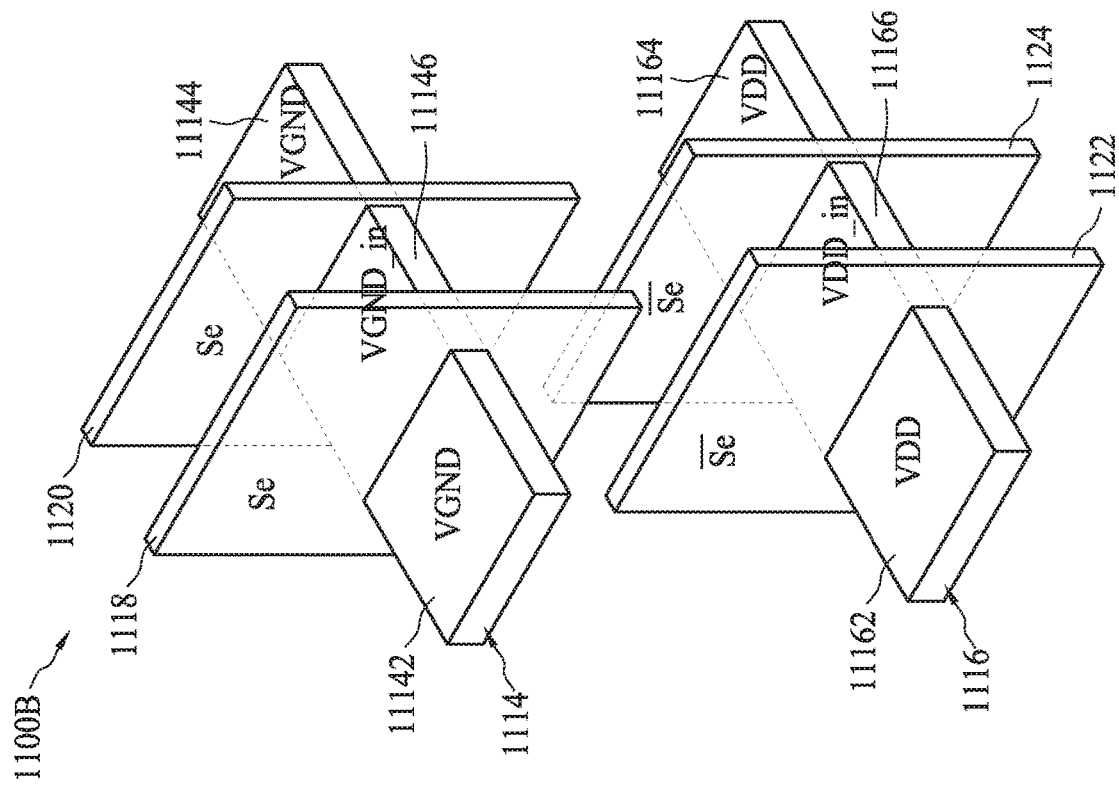
FIG. 11B is a diagram illustrating a layout structure of a power switch circuit in accordance with some embodiments.
Figure 11A:
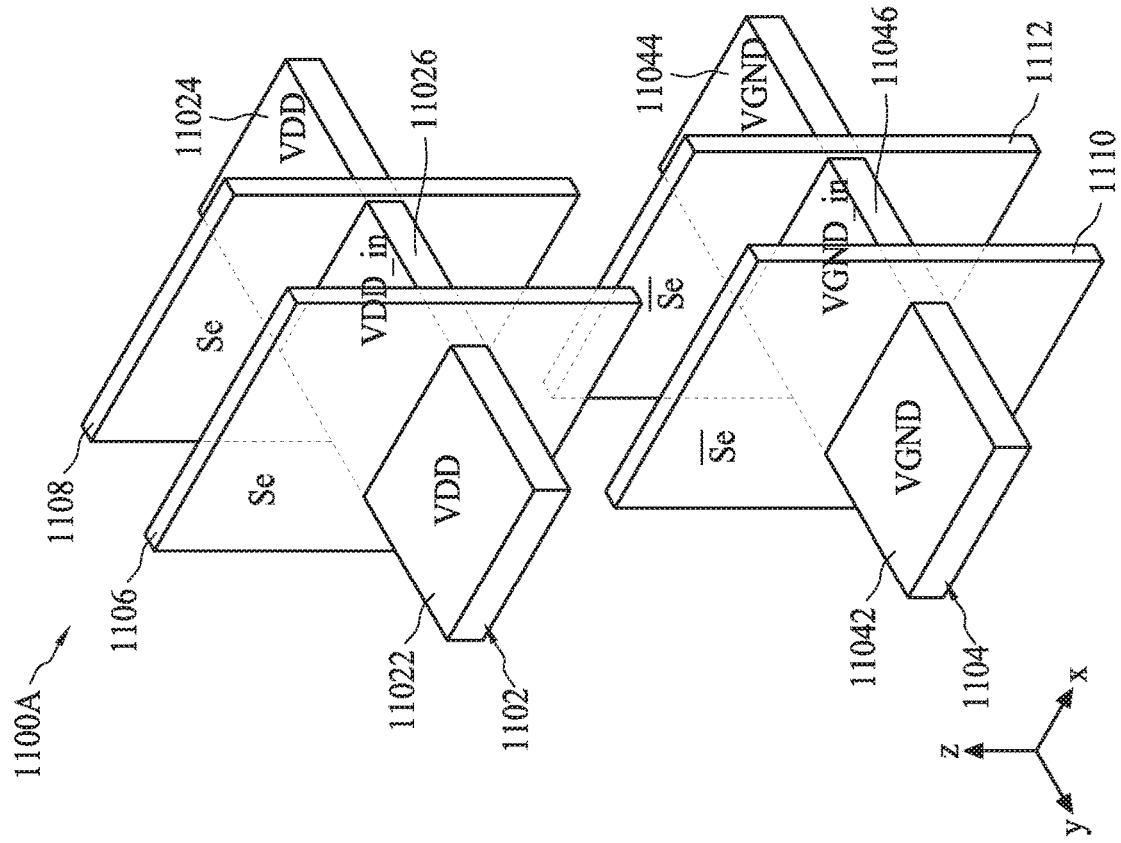
FIG. 11A is a diagram illustrating a layout structure of a power switch circuit in accordance with some embodiments.

FIG. 11A is a diagram illustrating an IC structure 1100A of a power switch circuit in accordance with some embodiments. The IC structure 1100A may be a portion of a CFET IC structure in which the p-type diffusion nanowire is vertically stacked on the n-type diffusion nanowire. In comparison to the power switch circuit of FIG. 9A, the power switch circuit of FIG. 11A is configured to be a header switch and a footer switch of an IC module. Except for the connecting signals, the IC structure 1100A is similar to the IC structure 900A. Therefore, the detailed description of the IC structure 1100A is omitted here for brevity.

According to some embodiments, the p-type diffusion nanowire 1102 and the conductive layers 1106 and 1108 are configured to be a PFET of the header switch of the IC module. The n-type diffusion nanowire 1104 and the conductive layers 1110 and 1112 are configured to be an NFET of the footer switch of the IC module. The conductive layers 1106 and 1108 are electrically connected to an enable signal (e.g. Se) of the power switch circuit. The nanowire portions 11022 and 11024 are electrically connected to a core supply voltage (e.g. VDD) and the nanowire portion 11026 is arranged to provide an intermediate supply voltage (e.g. VDD_in) to the IC module. In addition, the conductive layers 1110 and 1112 are electrically connected to an inverting signal of the enable signal (e.g. the inverted voltage level of the enable signal Se) of the power switch circuit. In addition, the nanowire portions 11042 and 11044 are electrically connected to a core ground voltage (e.g. VGND) and the nanowire portion 11046 is arranged to provide an intermediate ground voltage (e.g. VGND_in) to the IC module.

FIG. 11B is a diagram illustrating an IC structure 1100B of a power switch circuit in accordance with some embodiments. The IC structure 1100B may be a portion of a CFET IC structure in which the n-type diffusion nanowire is vertically stacked on the p-type diffusion nanowire. In comparison to the power switch circuit of FIG. 9B, the power switch circuit of FIG. 11B is configured to be a footer switch and a header switch of an IC module. Except for the connecting signals, the IC structure 1100B is similar to the IC structure 900B. Therefore, the detailed description of the IC structure 1100B is omitted here for brevity.

According to some embodiments, the n-type diffusion nanowire 1114 and the conductive layers 1118 and 1120 are configured to be an NFET of the footer switch of the IC module. The p-type diffusion nanowire 1116 and the conductive layers 1122 and 1124 are configured to be a PFET of the header switch of the IC module. The conductive layers 1118 and 1110 are electrically connected to an enable signal (e.g. Se) of the power switch circuit. The nanowire portions 11142 and 11144 are electrically connected to a core ground voltage (e.g. VGND) and the nanowire portion 11146 is arranged to provide an intermediate ground voltage (e.g. VGND_in) to the IC module. In addition, the conductive layers 1122 and 1124 are electrically connected to an inverting signal of the enable signal (e.g. the inverted voltage level of the enable signal Se) of the power switch circuit. In addition, the nanowire portions 11162 and 11164 are electrically connected to a core supply voltage (e.g. VDD) and the nanowire portion 11166 is arranged to provide an intermediate supply voltage (e.g. VDD_in) to the IC module.

According to some embodiments, the p-type diffusion nanowire 1102 and the n-type diffusion nanowire 1104 (as well as the n-type diffusion nanowire 1114 and the p-type diffusion nanowire 1116) are two consecutive gate-all-around nanowires disposed on the z-axis, in which the p-type diffusion nanowire 1102 is configured to be the header switch of the IC mode and the n-type diffusion nanowire 1104 is configured to be the footer switch of the IC mode. As shown in FIG. 7 and FIG. 8, the p-type diffusion nanowire 1102 may be the p-type diffusion nanowire 702, and the n-type diffusion nanowire 1104 may be the n-type diffusion nanowire 704. Therefore, the present power switch circuit may be implemented by the CFET structure without extra area penalty.

Figure 12B:
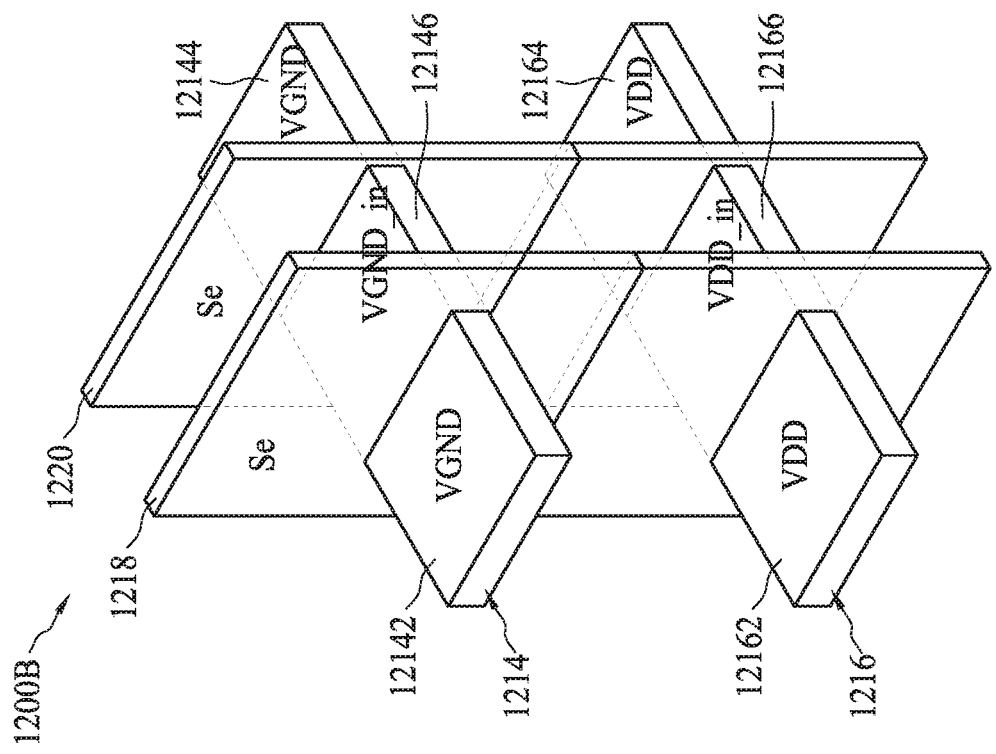
FIG. 12B is a diagram illustrating a layout structure of a power switch circuit in accordance with some embodiments.
Figure 12A:
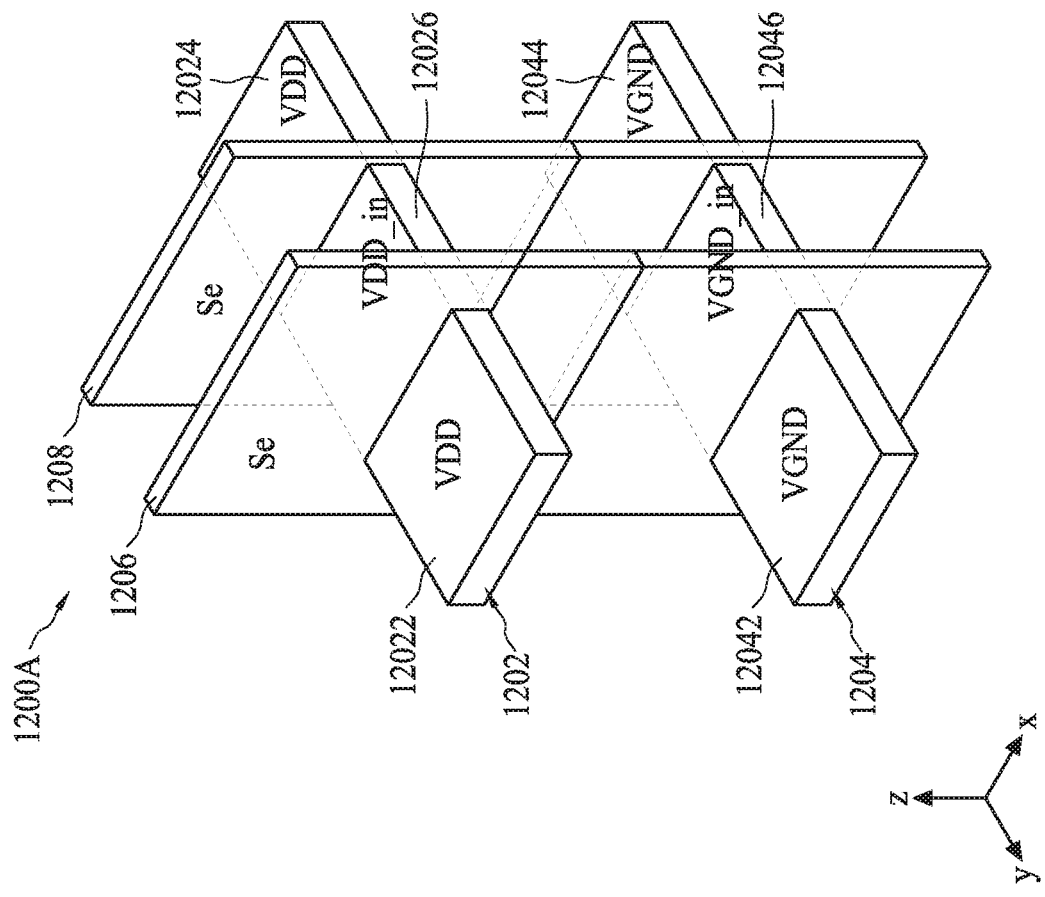
FIG. 12A is a diagram illustrating a layout structure of a power switch circuit in accordance with some embodiments.

FIG. 12A is a diagram illustrating an IC structure 1200A of a power switch circuit in accordance with some embodiments. The IC structure 1200A may be a portion of a CFET IC structure in which the p-type diffusion nanowire is vertically stacked on the n-type diffusion nanowire. In comparison to the power switch circuit of FIG. 9A, the conductive layers 906 and 910 are configured to be a single conductive layer 1206, the conductive layers 908 and 912 are configured to be a single conductive layer 1208, and the power switch circuit of FIG. 12A is configured to be a header switch and a footer switch of an IC module. The detailed description of the IC structure 1200A is omitted here for brevity.

According to some embodiments, the p-type diffusion nanowire 1202 and the conductive layers 1206 and 1208 are configured to be a PFET of the header switch of the IC module. The n-type diffusion nanowire 1204 and the conductive layers 1206 and 1208 are configured to be an NFET of the footer switch of the IC module. The conductive layers 1206 and 1208 are electrically connected to an enable signal (e.g. Se) of the power switch circuit. The p-type diffusion nanowire 1202 and the n-type diffusion nanowire 1204 are gated by the upper portions of the conductive layers 1206 and 1208 and the upper portions of the conductive layers 1206 and 1208 respectively. Accordingly, in this embodiment, the PFET of the header switch and the NFET of the footer switch are controlled by the same enable signal.

The nanowire portions 12022 and 12024 are electrically connected to a core supply voltage (e.g. VDD) and the nanowire portion 12026 is arranged to provide an intermediate supply voltage (e.g. VDD_in) to the IC module. The nanowire portions 12042 and 12044 are electrically connected to a core ground voltage (e.g. VGND) and the nanowire portion 12046 is arranged to provide an intermediate ground voltage (e.g. VGND_in) to the IC module.

FIG. 12B is a diagram illustrating an IC structure 1200B of a power switch circuit in accordance with some embodiments. The IC structure 1200B may be a portion of a CFET IC structure in which the n-type diffusion nanowire is vertically stacked on the p-type diffusion nanowire. In comparison to the power switch circuit of FIG. 9B, the conductive layers 918 and 922 are configured to be a single conductive layer 1218, the conductive layers 920 and 924 are configured to be a single conductive layer 1220, and the power switch circuit of FIG. 12B is configured to be a footer switch and a header switch of an IC module. The detailed description of the IC structure 1200B is omitted here for brevity.

According to some embodiments, the n-type diffusion nanowire 1214 and the conductive layers 1218 and 1220 are configured to be a NFET of the footer switch of the IC module. The p-type diffusion nanowire 1216 and the conductive layers 1218 and 1220 are configured to be a PFET of the header switch of the IC module. The conductive layers 1218 and 1220 are electrically connected to an enable signal (e.g. Se) of the power switch circuit. The n-type diffusion nanowire 1214 and the p-type diffusion nanowire 1216 are gated by the upper portions of the conductive layers 1218 and 1220 and the lower portions of the conductive layers 1218 and 1220 respectively. Accordingly, in this embodiment, the NFET of the footer switch and the PFET of the header switch are controlled by the same enable signal.

The nanowire portions 12142 and 12144 are electrically connected to a core ground voltage (e.g. VGND) and the nanowire portion 12146 is arranged to provide an intermediate ground voltage (e.g. VGND_in) to the IC module. The nanowire portions 12162 and 12164 are electrically connected to a core supply voltage (e.g. VDD) and the nanowire portion 12166 is arranged to provide an intermediate supply voltage (e.g. VDD_in) to the IC module.

In addition, the number of the conductive layers (i.e. the two nets 1206 and 1208) of the power switch circuit in FIG. 12A and the number of the conductive layers (i.e. the two nets 1218 and 1220) of the power switch circuit in FIG. 12B are merely used for the descriptive purposes. The number of the conductive layers of the power switch circuit in FIG. 12A and the number of the conductive layers of the power switch circuit in FIG. 12B are not limited by 2. According to some embodiments, the number of the conductive layers of the power switch circuit in FIG. 12A and the number of the conductive layers of the power switch circuit in FIG. 12B are greater than 10 nets. When the number of the conductive layers of the power switch circuit in FIG. 12A and the number of the conductive layers of the power switch circuit in FIG. 12B are greater than 10 nets, the power switch circuit in FIG. 12A and the conductive layers of the power switch circuit in FIG. 12B may have relatively wide conductive paths to conduct the supply currents to the IC modules respectively.

According to some embodiments, the p-type diffusion nanowire 1202 and the n-type diffusion nanowire 1204 (as well as the n-type diffusion nanowire 1214 and the p-type diffusion nanowire 1216) are two consecutive gate-all-around nanowires disposed on the z-axis, in which the p-type diffusion nanowire 1202 is configured to be the header switch of the IC mode and the n-type diffusion nanowire 1204 is configured to be the footer switch of the IC mode. As shown in FIG. 7 and FIG. 8, the p-type diffusion nanowire 1202 may be the p-type diffusion nanowire 702, and the n-type diffusion nanowire 1204 may be the n-type diffusion nanowire 704. Therefore, the present power switch circuit may be implemented by the CFET structure without extra area penalty.

Figure 13B:
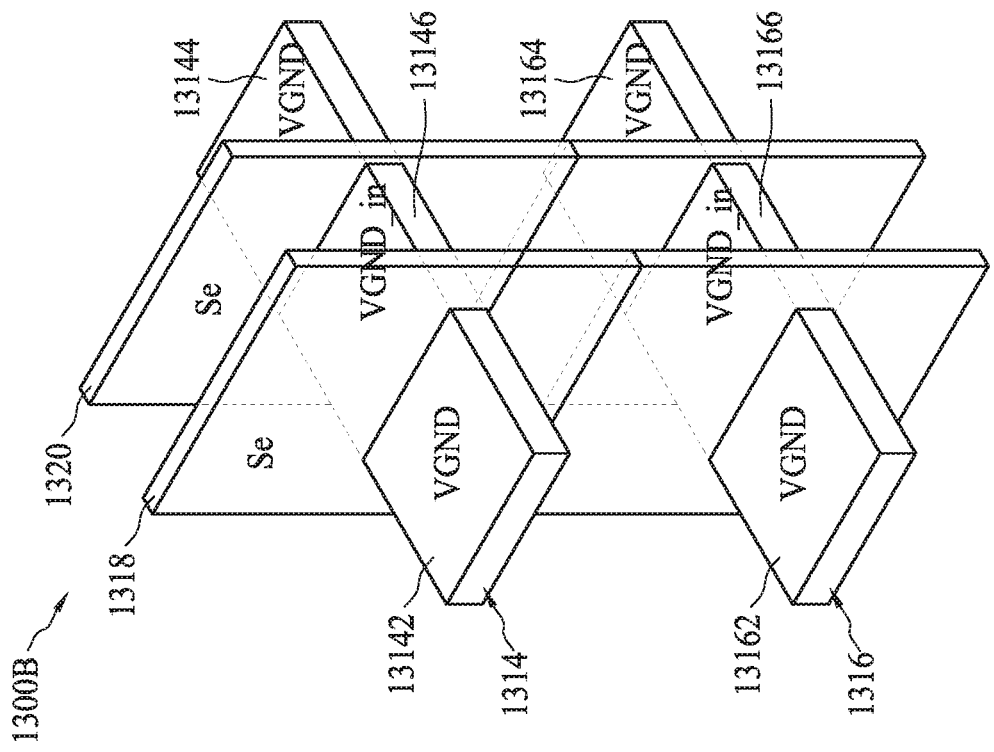
FIG. 13B is a diagram illustrating a layout structure of a power switch circuit in accordance with some embodiments.
Figure 13A:
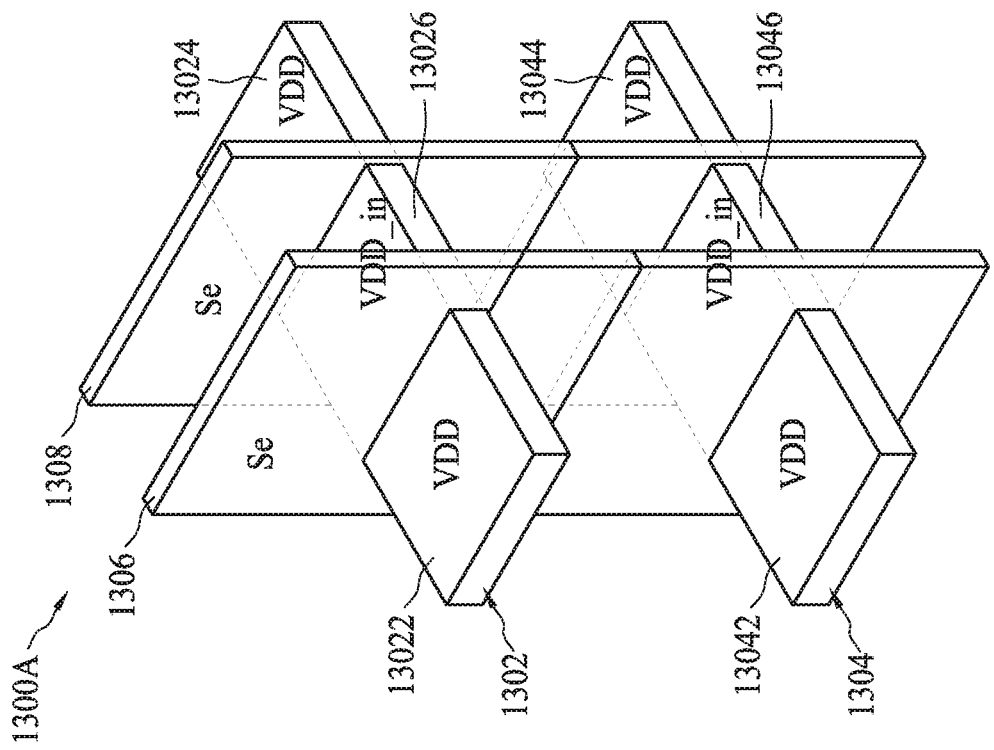
FIG. 13A is a diagram illustrating a layout structure of a power switch circuit in accordance with some embodiments.

FIG. 13A is a diagram illustrating an IC structure 1300A of a power switch circuit in accordance with some embodiments. The IC structure 1300A may be a portion of a CFET IC structure in which a p-type diffusion nanowire is vertically stacked on another p-type diffusion nanowire. In comparison to the power switch circuit of FIG. 12A, the p-type diffusion nanowire 1302 and the p-type diffusion nanowire 1304 of FIG. 13A are two consecutive nanowires along the z-axis, and the power switch circuit of FIG. 13A is configured to be a header switch of an IC module. The detailed description of the IC structure 1300A is omitted here for brevity.

According to some embodiments, the p-type diffusion nanowires 1302 and 1304 and the conductive layers 1306 and 1308 are configured to be two PFETs of the header switch of the IC module. The conductive layers 1306 and 1308 are electrically connected to an enable signal (e.g. Se) of the power switch circuit. The p-type diffusion nanowires 1302 and 1304 are gated by the conductive layers 1306 and 1308. Accordingly, in this embodiment, the PFETs of the header switch are controlled by the same enable signal.

The nanowire portions 13022, 13024, 13042, and 13044 are electrically connected to a core supply voltage (e.g. VDD) and the nanowire portions 13026 and 13046 are arranged to provide an intermediate supply voltage (e.g. VDD_in) to the IC module.

FIG. 13B is a diagram illustrating an IC structure 1300B of a power switch circuit in accordance with some embodiments. The IC structure 1300B may be a portion of a CFET IC structure in which an n-type diffusion nanowire is vertically stacked on another n-type diffusion nanowire. In comparison to the power switch circuit of FIG. 12B, the n-type diffusion nanowire 1314 and the n-type diffusion nanowire 1316 of FIG. 13A are two consecutive nanowires along the z-axis, and the power switch circuit of FIG. 13B is configured to be a footer switch of an IC module. The detailed description of the IC structure 1300B is omitted here for brevity.

According to some embodiments, the n-type diffusion nanowires 1314 and 1316 and the conductive layers 1318 and 1320 are configured to be two NFETs of the footer switch of the IC module. The conductive layers 1318 and 1320 are electrically connected to an enable signal (e.g. Se or the inverted Se) of the power switch circuit. The n-type diffusion nanowires 1314 and 1316 are gated by the conductive layers 1318 and 1320. Accordingly, in this embodiment, the NFETs of the footer switch are controlled by the same enable signal.

The nanowire portions 13142, 13144, 13162, and 13164 are electrically connected to a core ground voltage (e.g. VGND) and the nanowire portions 13146 and 13166 are arranged to provide an intermediate ground voltage (e.g. VGND_in) to the IC module.

According to some embodiments, the p-type diffusion nanowires 1302 and 1304 and the n-type diffusion nanowires 1314 and 1316 may be four consecutive nanowires along the z-axis, in which the p-type diffusion nanowires 1302 and 1304 are configured to be the header switch of the IC mode and the n-type diffusion nanowires 1314 and 1316 are configured to be the footer switch of the IC mode. Therefore, the present power switch circuit may be implemented by the CFET structure without extra area penalty.

According to some embodiments, the number of the conductive layers of the power switch circuits in FIG. 9A, FIG. 10A, FIG. 11A, and FIG. 13A, and the number of the conductive layers of the power switch circuits in FIG. 9B, FIG. 10B, FIG. 11B, and FIG. 13B are merely used for the descriptive purposes. To have relatively wide conductive paths to conduct the supply currents to the IC modules respectively, the number of the conductive layers of the power switch circuits in FIG. 9A, FIG. 10A, FIG. 11A, and FIG. 13A, and the number of the conductive layers of the power switch circuits in FIG. 9B, FIG. 10B, FIG. 11B, and FIG. 13B may be greater than 10 nets.

Figure 14:
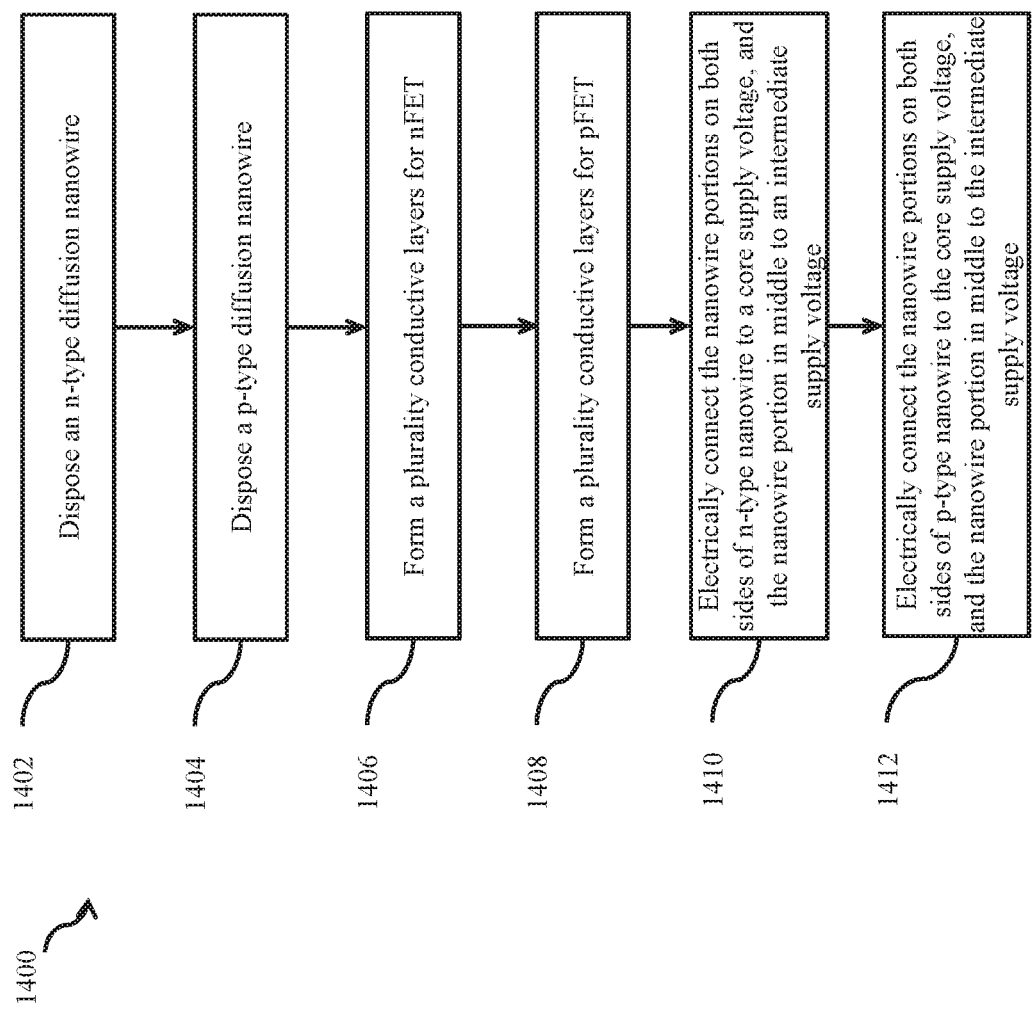
FIG. 14 is a flowchart illustrating a method of forming an IC structure in accordance with some embodiments.

FIG. 14 is a flowchart illustrating a method 1400 of forming an IC structure in accordance with some embodiments. The method 1400 may be performed in the operation 216 of FIG. 2. The method 1400 is executable by a semiconductor fabricator. Some of the operations in the method 1400 may by manually executed. According to some embodiments, the method 1400 may be arranged to form or fabricate the above mentioned IC structure 900A, 900B, 1000A, 1000B, 1100A, 1100B, 1200A, 1200B, 1300A, and 1300B. For the purpose of description, the method 1400 is described by using the example of IC structure 900A.

According to some embodiments, the method 1400 comprises operations 1402~1412. In operation 1402, the n-type diffusion nanowire 904 is disposed on a semiconductor substrate. In operation 1404, the p-type diffusion nanowire 902 is disposed over the n-type diffusion nanowire 904 along the z-axis.

In operation 1406, the plurality of conductive layers 910 and 912 are formed to surround the n-type diffusion nanowire 904 to form a gate electrode of an nFET. According to some embodiments, the plurality of conductive layers 910 and 912 are arranged to extend along the y-axis.

In operation 1408, the plurality of conductive layers 906 and 908 are formed to surround the p-type diffusion nanowire 902 to form a gate electrode of a pFET. According to some embodiments, the plurality of conductive layers 906 and 908 are arranged to extend along the y-axis.

It is noted that plurality of conductive layers 906, 908, 910, and 912 are not directly contacted with the p-type diffusion nanowire 902 and the n-type diffusion nanowire 904. For each conductive layer, at least a gate dielectric or a dielectric layer (not shown) is disposed between the conductive layer (e.g. 910) and the diffusion nanowire (e.g. 904).

In operation 1410, the nanowire portions 9042 and 9044 are electrically connected to a core supply voltage (e.g. VDD or VGND) and the nanowire portion 9046 is arranged to provide an intermediate supply voltage (e.g. VDD_in) to the IC module.

In operation 1412, the nanowire portions 9022 and 9024 are electrically connected to the core supply voltage (e.g. VDD or VGND) and the nanowire portion 9026 is arranged to provide the intermediate supply voltage (e.g. VDD_in) to the IC module.

According to some embodiments, for the IC structure 900A (as well as 900B, 1000A, 1000B, 1300A, and 1300B), the nanowire portions 9042 and 9044 are electrically connected to the nanowire portions 9022 and 9024 respectively. For the IC structure 1100A (as well as 1100B, 1200A, and 1200B), the nanowire portions 11042 and 11044 are physically separated from the nanowire portions 11022 and 11024 respectively.

According to some embodiments, the nanowire portions 9042, 9044, and 9046 are aligned with the nanowire portions 9022, 9024, and 9026 along the z-axis respectively. The conductive layers 906 and 908 are aligned with the conductive layers 910 and 912 along the z-axis respectively.

According to some embodiments, for the IC structure 900A (as well as 900B, 1000A, 1000B, 1100A, and 1100B), the method 1400 further comprises an operation to physically separate the conductive layers 906 and 908 from the conductive layers 910 and 912 respectively. On the other hand, for the IC structure 1200A (as well as 1200B, 1300A, and 1300B), the method 1400 further comprises an operation to electrically couple the upper portions of the conductive layers 1206 and 1208 to the lower portions of the conductive layers 1206 and 1208 respectively.

Briefly, the proposed embodiment provides a power switch circuit implemented by CFET structure. The power switch circuit may mitigate the different wake up times of the power switch circuit caused by the process variation. Moreover, the power switch circuit is arranged to reuse the dummy area in the CFET structure. Therefore, the performance the power switch circuit may be improved without the extra area penalty.

In some embodiments, the present disclosure provides an integrated circuit device. The integrated circuit device comprises an integrated circuit module, a first field-effect transistor, and a second field-effect transistor. The first field-effect transistor is coupled between the integrated circuit module and a first reference voltage, and controlled by a first controlled signal. The second field-effect transistor is coupled between the integrated circuit module and the first reference voltage. The second field-effect transistor is a complementary field-effect transistor of the first field-effect transistor, and the first field-effect transistor and the second field-effect transistor are configured to generate a second reference voltage for the integrated circuit module according to the first control signal.

In some embodiments, the present disclosure provides an IC structure. The IC structure comprises a first diffusion nanowire, a second diffusion nanowire, a plurality of first conductive layers, and a plurality of second conductive layers. The first diffusion nanowire is disposed on a substrate. The second diffusion nanowire is stacked over the first diffusion nanowire along a first direction. The plurality of first conductive layers is arranged to surround the first diffusion nanowire to form a first gate electrode, wherein the plurality of first conductive layers are arranged to extend along a second direction. The plurality of second conductive layers is arranged to surround the second diffusion nanowire to form a second gate electrode, wherein the plurality of second conductive layers are arranged to extend along the second direction. A first portion of the first diffusion nanowire is electrically coupled to a first reference voltage, a second portion of the second diffusion nanowire is electrically coupled to a second reference voltage, and a third portion of the first diffusion nanowire is electrically coupled to a fourth portion of the second diffusion nanowire, the first portion of the first diffusion nanowire is aligned with the second portion of the second diffusion nanowire along the first direction, and the third portion of the first diffusion nanowire is aligned with the fourth portion of the second diffusion nanowire along the first direction.

In some embodiments, the present disclosure provides a method of forming an IC structure. The method comprises: disposing a first diffusion nanowire on a substrate; disposing a second diffusion nanowire over the first diffusion nanowire along a first direction; forming a plurality of first conductive layers to surround the first diffusion nanowire to form a first gate electrode, wherein the plurality of first conductive layers are arranged to extend along a second direction; forming a plurality of second conductive layers to surround the second diffusion nanowire to form a second gate electrode, wherein the plurality of second conductive layers are arranged to extend along the second direction; wherein a first portion of the first diffusion nanowire is configured to be electrically coupled to a first reference voltage and a second portion of the second diffusion nanowire is configured to be electrically coupled to a second reference voltage; a third portion of the first diffusion nanowire is configured to be electrically coupled to a fourth portion of the second diffusion nanowire; wherein the first portion of the first diffusion nanowire is aligned with the second portion of the second diffusion nanowire along the first direction, and the third portion of the first diffusion nanowire is aligned with the fourth portion of the second diffusion nanowire along the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
a first diffusion nanowire, disposed on a substrate;
a second diffusion nanowire, stacked over the first diffusion nanowire along a first direction;
a plurality of first conductive layers, arranged to surround the first diffusion nanowire to form a first gate electrode, wherein the plurality of first conductive layers are arranged to extend along a second direction; and
a plurality of second conductive layers, arranged to surround the second diffusion nanowire to form a second gate electrode, wherein the plurality of second conductive layers are arranged to extend along the second direction;
wherein a first portion of the first diffusion nanowire is configured to be electrically coupled to a first reference voltage, a second portion of the second diffusion nanowire is configured to be electrically coupled to a second reference voltage, and a third portion of the first diffusion nanowire is configured to be electrically coupled to a fourth portion of the second diffusion nanowire, the first portion of the first diffusion nanowire is aligned with the second portion of the second diffusion nanowire along the first direction, and the third portion of the first diffusion nanowire is aligned with the fourth portion of the second diffusion nanowire along the first direction.

2. The IC structure of claim 1, wherein the plurality of first conductive layers are aligned with the plurality of second conductive layers along the first direction respectively, and the plurality of first conductive layers are physically separated from the plurality of second conductive layers.

3. The IC structure of claim 2, wherein the first diffusion nanowire is an n-type diffusion nanowire, and the second diffusion nanowire is a p-type diffusion nanowire.

4. The IC structure of claim 2, wherein the first diffusion nanowire is a p-type diffusion nanowire, and the second diffusion nanowire is an n-type diffusion nanowire.

5. The IC structure of claim 1, wherein the plurality of first conductive layers are aligned with the plurality of second conductive layers along the first direction respectively, and the plurality of first conductive layers are electrically coupled to the plurality of second conductive layers respectively.

6. The IC structure of claim 5, wherein the first diffusion nanowire and the second diffusion nanowire are p-type diffusion nanowire.

7. The IC structure of claim 5, wherein the first diffusion nanowire and the second diffusion nanowire are n-type diffusion nanowire.

8. The IC structure of claim 1, wherein the first reference voltage and the second reference voltage are the same reference voltage.

9. The IC structure of claim 1, wherein the first reference voltage and the second reference voltage are different reference voltages.

10. A method of forming an integrated circuit (IC) structure, comprising:
disposing a first diffusion nanowire on a substrate;
disposing a second diffusion nanowire over the first diffusion nanowire along a first direction;
forming a plurality of first conductive layers to surround the first diffusion nanowire to form a first gate electrode, wherein the plurality of first conductive layers are arranged to extend along a second direction; and
forming a plurality of second conductive layers to surround the second diffusion nanowire to form a second gate electrode, wherein the plurality of second conductive layers are arranged to extend along the second direction;
wherein a first portion of the first diffusion nanowire is configured to be electrically coupled to a first reference voltage and a second portion of the second diffusion nanowire is configured to be electrically coupled to a second reference voltage; a third portion of the first diffusion nanowire is configured to be electrically coupled to a fourth portion of the second diffusion nanowire; and the first portion of the first diffusion nanowire is aligned with the second portion of the second diffusion nanowire along the first direction, and the third portion of the first diffusion nanowire is aligned with the fourth portion of the second diffusion nanowire along the first direction.

11. The method of claim 10, further comprising:
physically separating the plurality of first conductive layers from the plurality of second conductive layers.

12. The method of claim 10, further comprising:
electrically coupling the plurality of first conductive layers to the plurality of second conductive layers respectively.

13. The method of claim 10, wherein the plurality of first conductive layers are aligned with the plurality of second conductive layers along the first direction respectively.

14. The method of claim 10, wherein the first reference voltage and the second reference voltage are the same reference voltage.

15. The method of claim 10, wherein the first reference voltage and the second reference voltage are different reference voltages.

16. An integrated circuit (IC) structure, comprising:
a first diffusion nanowire, disposed on a substrate;
a second diffusion nanowire, stacked over the first diffusion nanowire along a first direction;
a plurality of first conductive layers, arranged to surround the first diffusion nanowire to form a first gate electrode, wherein the plurality of first conductive layers are arranged to extend along a second direction; and
a plurality of second conductive layers, arranged to surround the second diffusion nanowire to form a second gate electrode, wherein the plurality of second conductive layers are arranged to extend along the second direction, and aligned with the plurality of first conductive layers along the first direction respectively;
wherein one of the first diffusion nanowire and the second diffusion nanowire is a p-type diffusion nanowire, and the other of the first diffusion nanowire and the second diffusion nanowire is an n-type diffusion nanowire.

17. The IC structure of claim 16, wherein the plurality of first polysilicon layers are physically separated from the plurality of second polysilicon layers.

18. The IC structure of claim 16, wherein the plurality of first polysilicon layers are electrically coupled to the plurality of second polysilicon layers respectively.

19. The IC structure of claim 18, wherein a number of the plurality of first polysilicon layers and a number of the plurality of second polysilicon layers are more than 10.

20. The IC structure of claim 16, wherein a first portion of the first diffusion nanowire is electrically coupled to a first reference voltage, a second portion of the second diffusion nanowire is electrically coupled to a second reference voltage different from the second reference voltage, and the first portion of the first diffusion nanowire is aligned with the second portion of the second diffusion nanowire along the first direction.

* * * * *